(12) United States Patent
LaMarche et al.

(10) Patent No.: US 7,957,938 B2
(45) Date of Patent: *Jun. 7, 2011

(54) METHOD AND APPARATUS FOR A HIGH BANDWIDTH OSCILLOSCOPE UTILIZING MULTIPLE CHANNEL DIGITAL BANDWIDTH INTERLEAVING

(75) Inventors: Francois LaMarche, New Milford, NJ (US); Laxmikant Joshi, Palo Alto, CA (US); Anirudh Kailash Sureka, Mamaroneck, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 338 days.

This patent is subject to a terminal disclaimer.

(21) Appl. No.: 12/112,218

(22) Filed: Apr. 30, 2008

(65) Prior Publication Data

US 2009/0002213 A1    Jan. 1, 2009

Related U.S. Application Data

(63) Continuation-in-part of application No. 12/102,946, filed on Apr. 15, 2008, now Pat. No. 7,653,514, which is a continuation of application No. 11/729,606, filed on Mar. 29, 2007, now Pat. No. 7,373,281, which is a continuation of application No. 11/281,075, filed on Nov. 17, 2005, now Pat. No. 7,219,037, and a continuation-in-part of application No. 10/693,188, filed on Oct. 24, 2003, now Pat. No. 7,058,548.

(60) Provisional application No. 60/927,091, filed on May 1, 2007, provisional application No. 60/656,865, filed on Feb. 25, 2005, provisional application No. 60/656,616, filed on Feb. 25, 2005, provisional application No. 60/629,050, filed on Nov. 18, 2004, provisional application No. 60/420,937, filed on Oct. 24, 2002.

(51) Int. Cl.
*G01R 23/00* (2006.01)
*G06F 17/00* (2006.01)

(52) U.S. Cl. ............ 702/189; 702/75; 702/76; 341/155; 341/126

(58) Field of Classification Search ................. 702/189, 702/66, 67, 75, 76
See application file for complete search history.

(56) References Cited

U.S. PATENT DOCUMENTS 3,783,413 A   1/1974   Froment et al.
(Continued)

FOREIGN PATENT DOCUMENTS

EP        0275136       7/1988
(Continued)

OTHER PUBLICATIONS

USPTO Office Action dated Apr. 24, 2009 which issued in U.S. Appl. No. 12/102,946, entitled: High Bandwidth Oscilloscope which was filed on Apr. 15, 2008., 1-12.

(Continued)

*Primary Examiner* — Hal D Wachsman
(74) *Attorney, Agent, or Firm* — Gordon Kessler

(57) ABSTRACT

A method of digitizing an analog signal is provided, comprising the steps of separating the analog signal spanning a frequency range into a plurality of frequency bands, and then translating at least one of the signals to a lower frequency band in accordance with a local oscillator and digitizing the at least one translated signal with digitizing elements having a frequency range less than the analog signal frequency range. A fixed relationship of the phase of the local oscillator and a repetitive signal generated in accordance with a writing to a circular buffer of the digitized representation of the at least one of the plurality of frequency bands is then defined. Signals corresponding to the other of the plurality of frequency bands are digitized and written to corresponding circular buffers. Finally, a digital representation of the analog signal is formed from the digitized signals.

16 Claims, 22 Drawing Sheets

U.S. PATENT DOCUMENTS

| | | | |
|---|---|---|---|
| 3,891,803 A | 6/1975 | Daguet et al. | |
| 3,903,484 A | 9/1975 | Testani | |
| 4,181,822 A * | 1/1980 | Workman | 704/201 |
| 4,316,282 A | 2/1982 | Macina et al. | |
| 4,354,277 A | 10/1982 | Crackel et al. | |
| 4,570,153 A | 2/1986 | Kobayashi et al. | |
| 5,187,803 A | 2/1993 | Sohner et al. | |
| 5,323,391 A | 6/1994 | Harrison | |
| 5,412,690 A | 5/1995 | Kotzin et al. | |
| 5,469,219 A | 11/1995 | Mortensen | |
| 5,659,546 A | 8/1997 | Elder | |
| 5,668,836 A | 9/1997 | Smith et al. | |
| 5,937,341 A | 8/1999 | Suominen | |
| 5,950,119 A | 9/1999 | McGeehan et al. | |
| 5,978,742 A | 11/1999 | Pickerd | |
| 6,240,150 B1 | 5/2001 | Darveau et al. | |
| 6,242,899 B1 | 6/2001 | Miller | |
| 6,271,773 B1 | 8/2001 | Kobayashi | |
| 6,340,883 B1 | 1/2002 | Nara et al. | |
| 6,380,879 B2 | 4/2002 | Kober et al. | |
| 6,542,914 B1 | 4/2003 | Pupalaikis | |
| 6,567,030 B1 | 5/2003 | Pupalaikis | |
| 6,701,335 B2 | 3/2004 | Pupalaikis | |
| 6,819,279 B2 | 11/2004 | Pupalaikis | |
| 7,050,918 B2 | 5/2006 | Pupalaikis et al. | |
| 7,219,037 B2 * | 5/2007 | Pupalaikis et al. | 702/189 |
| 7,295,826 B1 * | 11/2007 | Cook et al. | 455/323 |
| 7,373,281 B2 * | 5/2008 | Pupalaikis et al. | 702/189 |
| 7,653,514 B2 * | 1/2010 | Pupalaikis et al. | 702/189 |
| 2002/0150173 A1 | 10/2002 | Buda | |
| 2002/0181614 A1 | 12/2002 | Mostafa et al. | |
| 2004/0041599 A1 | 3/2004 | Murphy et al. | |
| 2004/0246047 A1 | 12/2004 | Manku et al. | |
| 2004/0252044 A1 * | 12/2004 | Mathis et al. | 341/155 |
| 2005/0273482 A1 | 12/2005 | Moore | |
| 2006/0247870 A1 | 11/2006 | Pickerd | |
| 2006/0267811 A1 | 11/2006 | Tan | |
| 2007/0273567 A1 * | 11/2007 | LaMarche | 341/144 |

FOREIGN PATENT DOCUMENTS

| | | |
|---|---|---|
| EP | 0589594 | 3/1994 |
| JP | 06197019 | 7/1994 |

OTHER PUBLICATIONS

"A matter of time: Today's RF signals call for a different kind of spectrum analysis", *Tektronix, Inc*, (2000),1-8.

"Advanced transmission library: Optional block function library for hypersignal block diagram/ride", *Hyperception, Inc*, (1997),1-2.

"Agilent E5052A signal source analyzer 10MHz to 7GHz", *Agilent Technologies*, (Jun. 9, 2004),1, 6, 7.

"Digital Signal Processing Applications Using the ADSP-2100 Family", *Prentice Hall*, (1990),458-461.

"Electronics engineers' handbook", (1975).

"Genesys, 2004 RF Microwave Design Software—Simulation", *Eagleware Corporation*, (2004),108-110.

"Putting undersampling to work", *Pentek, Inc*, 1-2 , Mar. 9, 2004.

"R3681 Signal analyzer", *Advantest*, (2004),1-2.

"Real-time spectrum analysis tools aid transition to third-generation wireless technology", *Tektronix, Inc*, (1999),1-6.

"Sampling and reconstruction of periodic signals", DSP-FPGA. COM, 1-15, Oct. 15, 2004.

"Signature—high performance signal analyzer 100Hz to 8GHz", *Anritsu*, (2000),1-2.

Adam, Stephen F., "Microwave Theory and Applications", *Prentice Hall*, (1969),490-500.

Apolinario, Jr, J.A. , et al., "On perfect reconstruction in critically sampled frequency-domain scrambler", 1-4, Sep. 1997.

Ding, G , et al., "Frequency-interleaving technique for high-speed A/D conversion", *IEEE*, (2003),I857-I860.

Hoyos, Sebastian , et al., "Analog to digital conversion of ultra-wideband signals in orthogonal spaces", *IEEE*, (2003),47-51.

Johannson, Hakan , et al., "Reconstruction of Nonuniformly sampled bandlimited signals by means of digital fractional delay filters", IEEE Transactions on signal processing vol. 50 No. 11,(Nov. 2002),2757-2767.

Jong, "Methods of Discrete Signal and Systems Analysis", *McGraw-Hill*, (1982),369-373.

Lee, Hyung-Jin , et al., "Frequency domain approach for CMOS ultra-wideband radios", *Proceedings for the IEEE computer society annual symposium on VLSI*, (2003),1-2.

Lyons, Richard G., "Understanding digital signal processing", *Prentice Hall professional technical reference*, second edition, (2004),30-39, 346-360, 471-479, 571-572.

Mueller, James J., et al., "Method and Apparatus for Artifact Signal Reduction in Systems of Mismatched Interleaved Digitizers" U.S. Appl. No. 11/280,493, filed Nov. 16, 2005.

Paquelet, Stephanie , et al., "RF front-end considerations for SDR Ultra-wideband communications systems", *RF Design*, (Jul. 2004),44-51.

Pupalaikis, Peter J., "Bilinear Transformation Made Easy", *ICSPAT 2000 Proceedings, CMP Publications*, (2000),1-5.

Pupalaikis, Peter J., et al., "Method of Crossover Region Phase Correction when Summing Multiple Frequency Bands", U.S. Appl. No. 11/280,671, filed Nov. 16, 2005.

Smith, Julius O., "MUS420/EE367A Lecture 4A, Interpolated Delay Lines, Ideal Bandlimited Interpolation, and Fractional Delay Filter Design", *Stanford University*, 1-50, Dec. 28, 2005.

Velazquez, Scott R., et al., "Design of hybrid filter banks for analog/digital conversion", *IEEE transactions on signal processing* vol. 46, No. 4, (Apr. 4, 1998),956-967.

Velazquez, Scott R., "High-performance advanced filter bank analog-to-digital converter for universal RF receivers", *V Company, IEEE*, (1998),229-232.

Intel Integrated Performance Primitives for Intel Architecture, Reference manual. vol. 1: Signal Processing (2000), 1-1242.

* cited by examiner

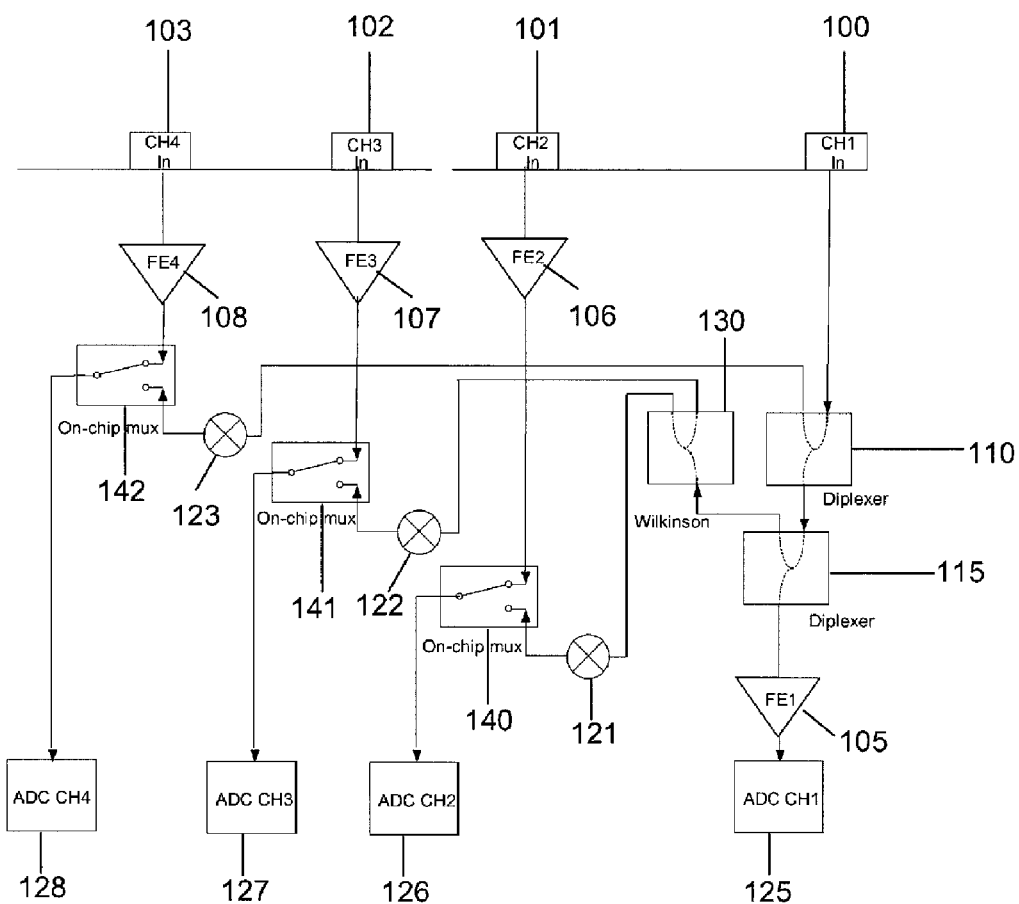
Figure 1 – Top Level Signal Switching Diagram

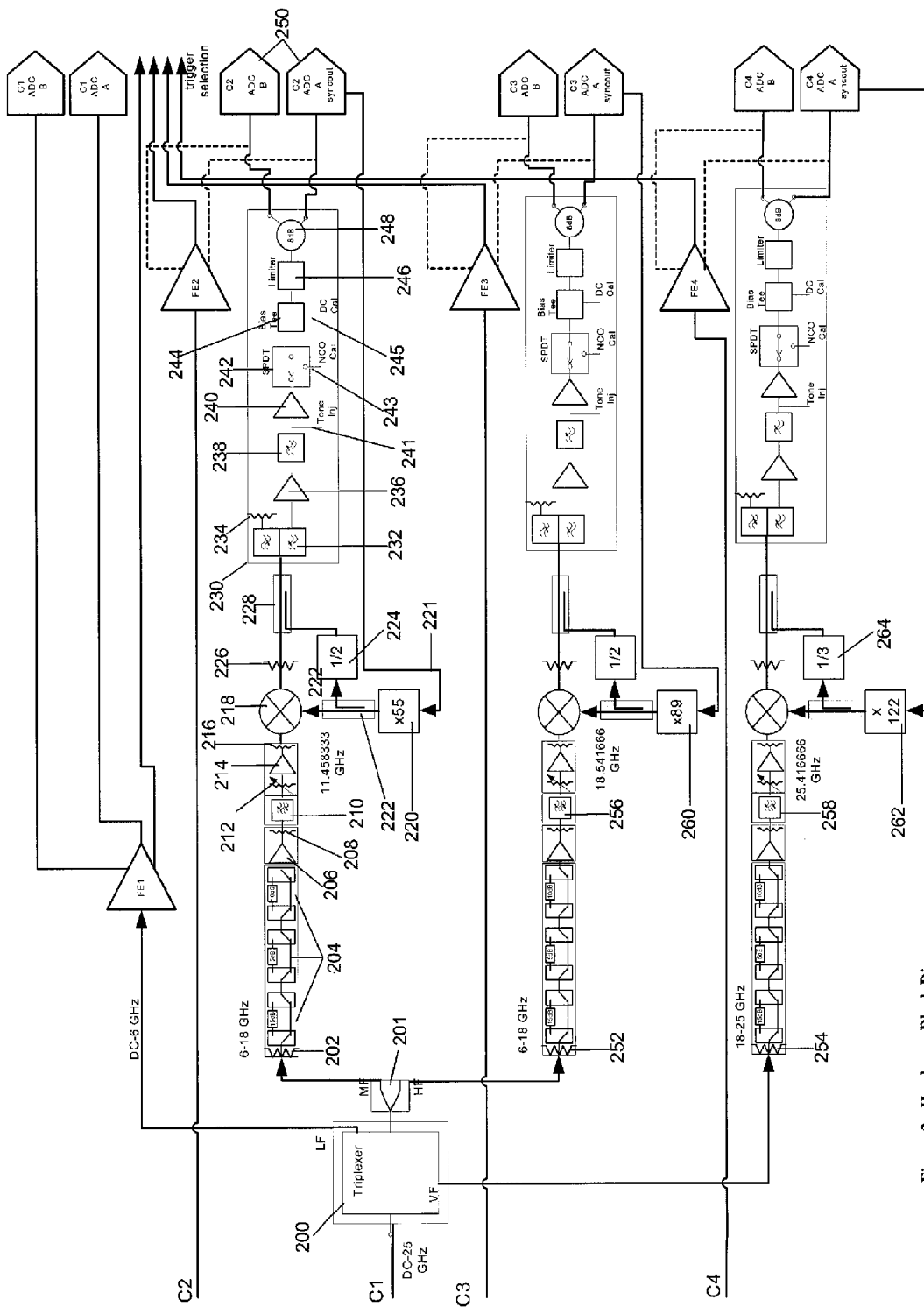
Figure 2 - Hardware Block Diagram

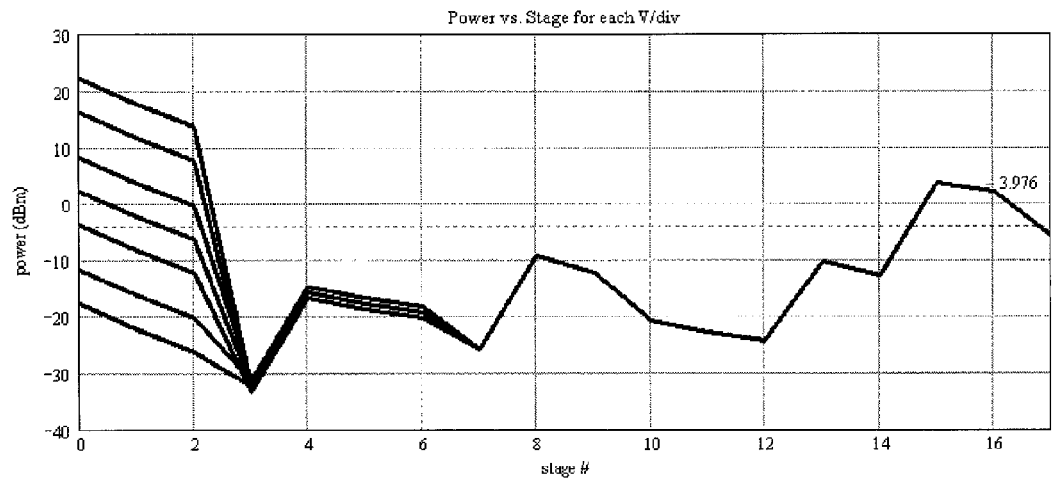
Figure 3 - MF Band power levels
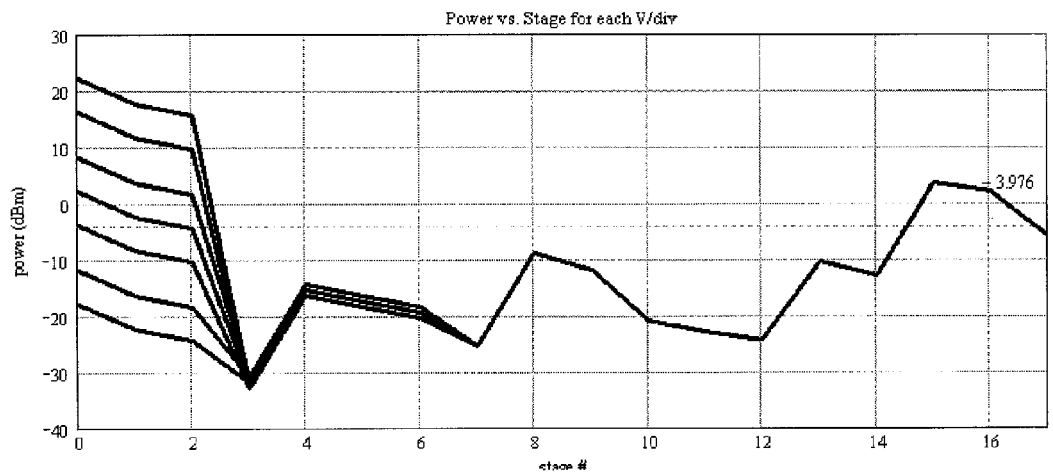
Figure 4 - HF band power levels

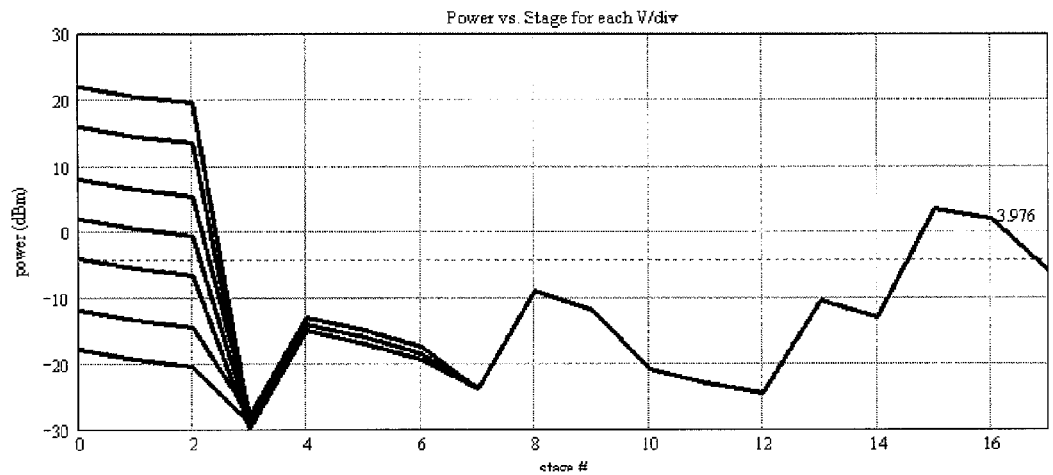
Figure 5 – VF band power levels
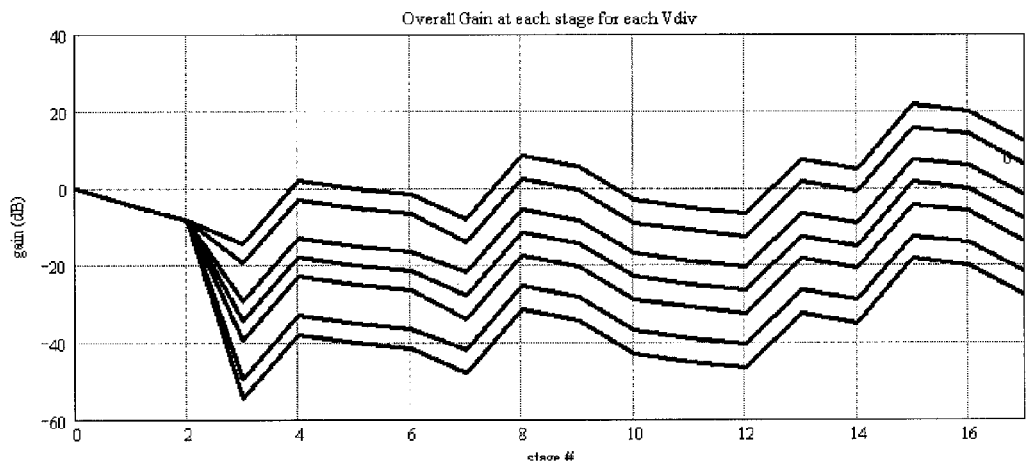
Figure 6 – MF band cumulative gain

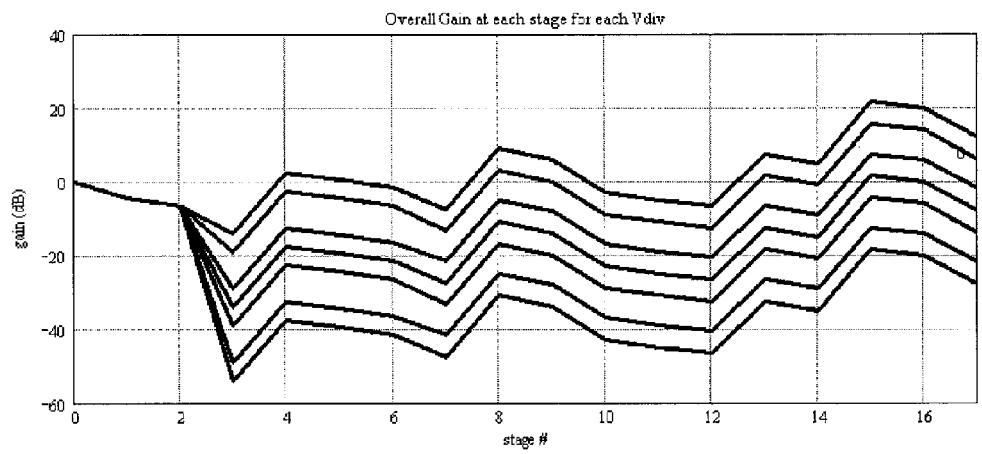
Figure 7 – HF band cumulative gain
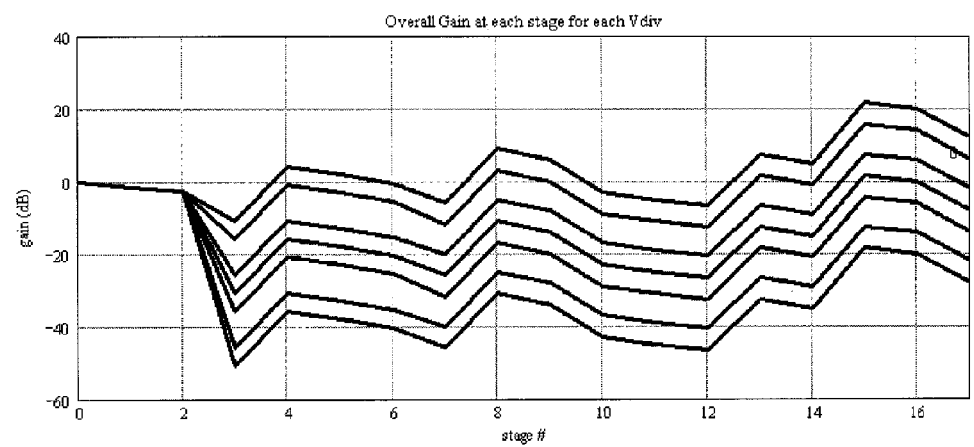
Figure 8 – VF band cumulative gain

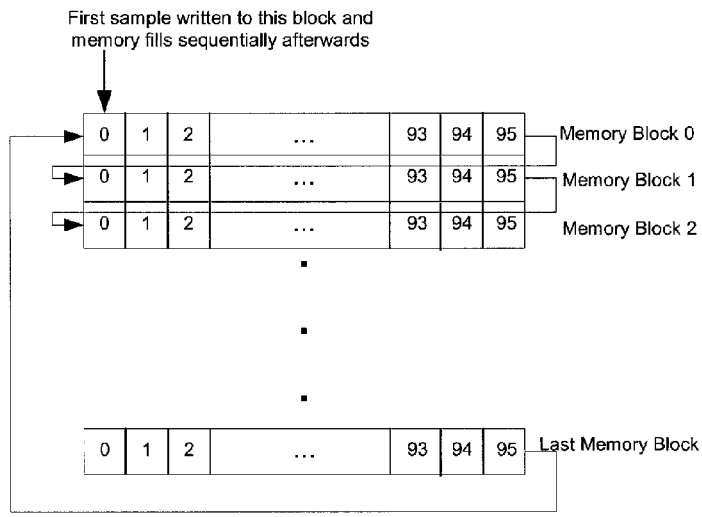
Figure 9 – Circular Memory Buffer Organization
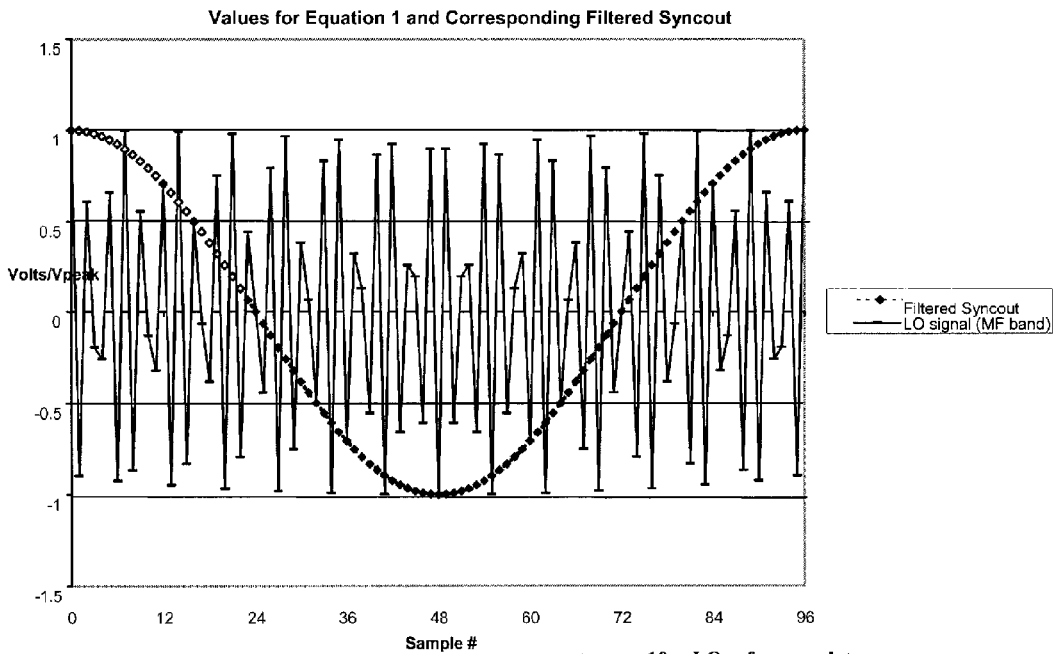
Figure 10 – LO reference plot

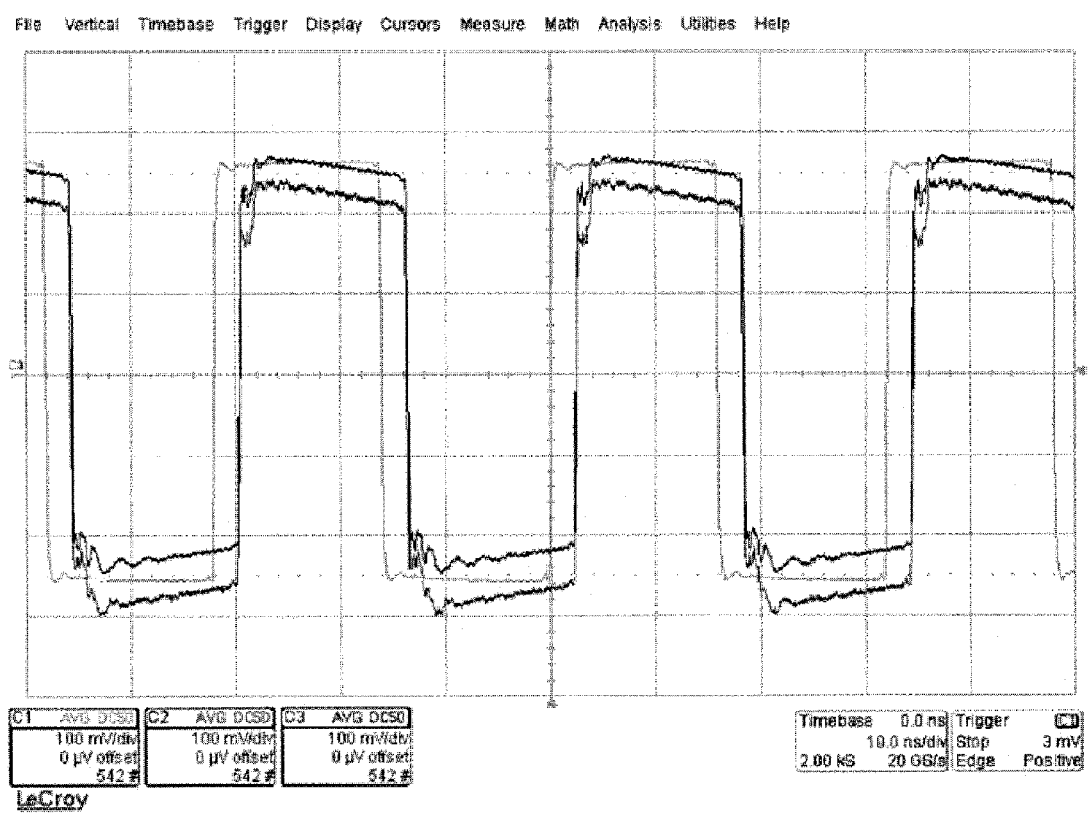
Figure 11 – Delay Calibration Clocks for the LF, MF, and HF bands

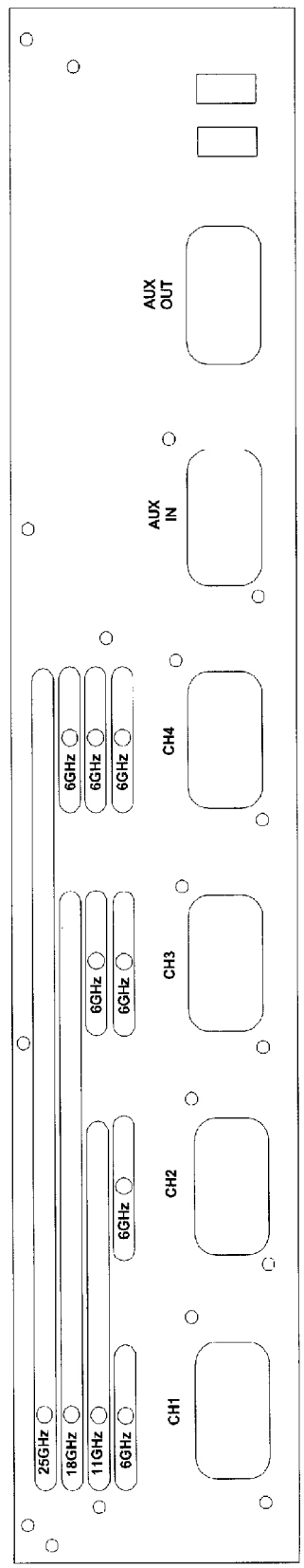
Figure 12 – Oscilloscope Front Panel Overlay Depicting all channel combinations

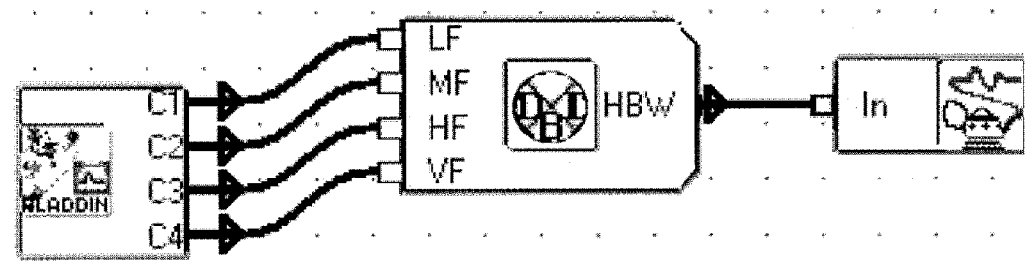
Figure 13 – DBI Processors in the Processing Web

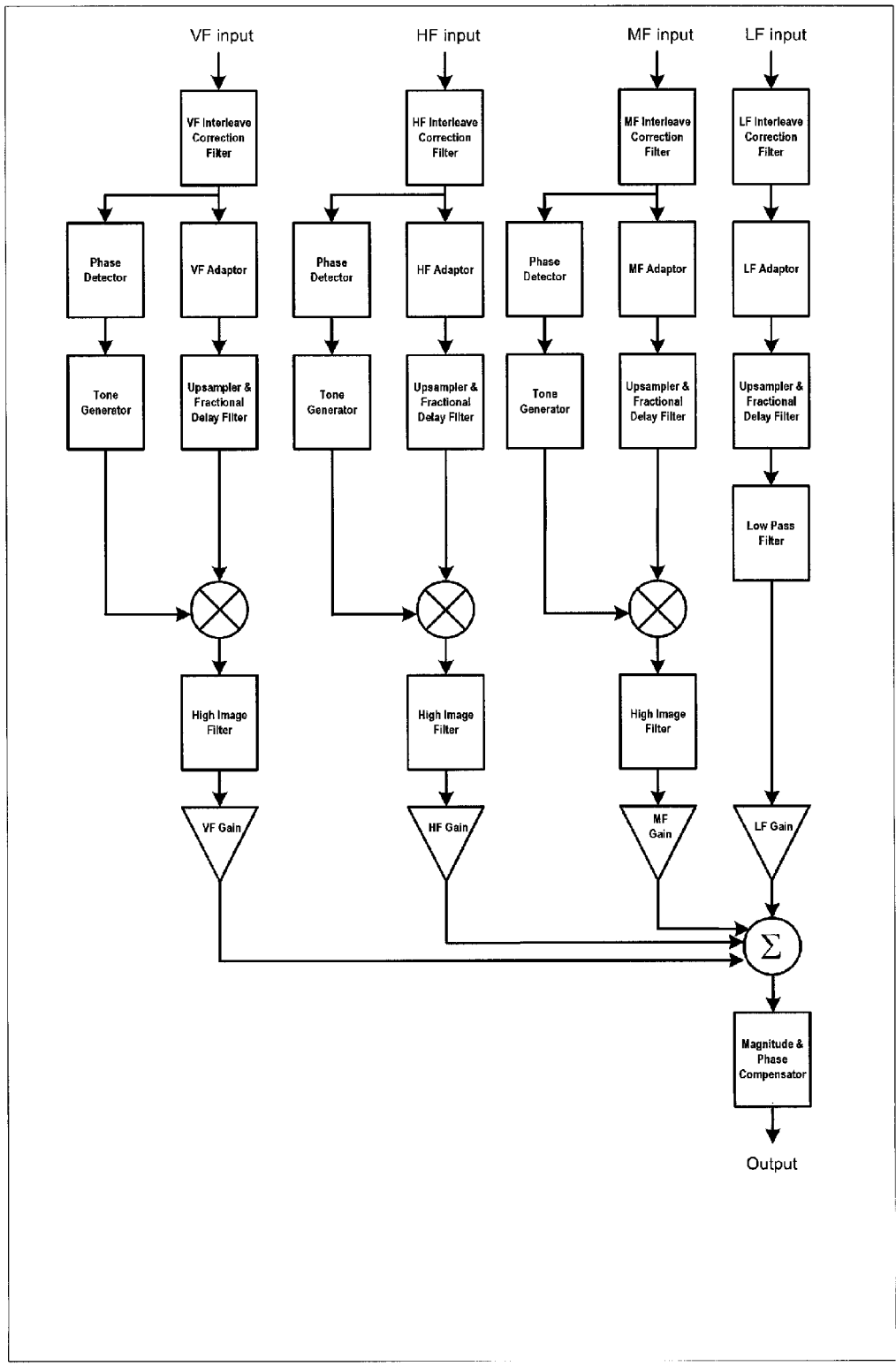
Figure 14 – Digital System Block Diagram

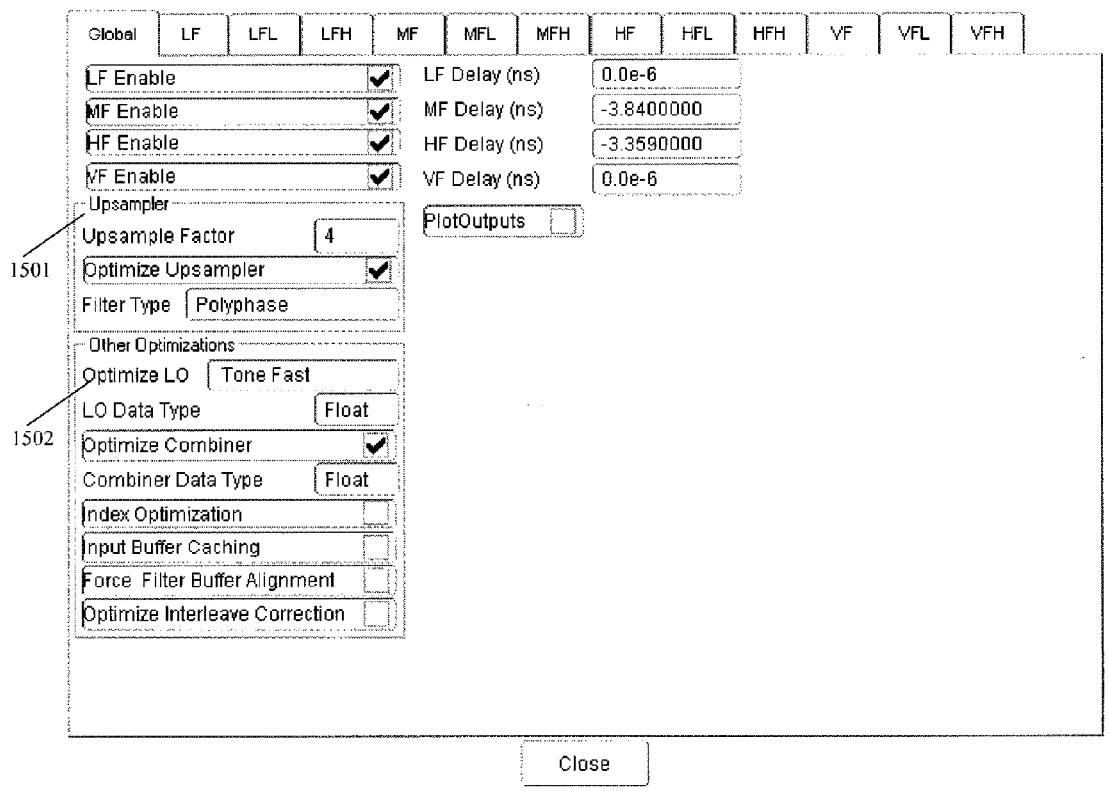
Figure 15 – Digital System Global Settings Page

Figure 16 – Digital System LF Path Settings Page

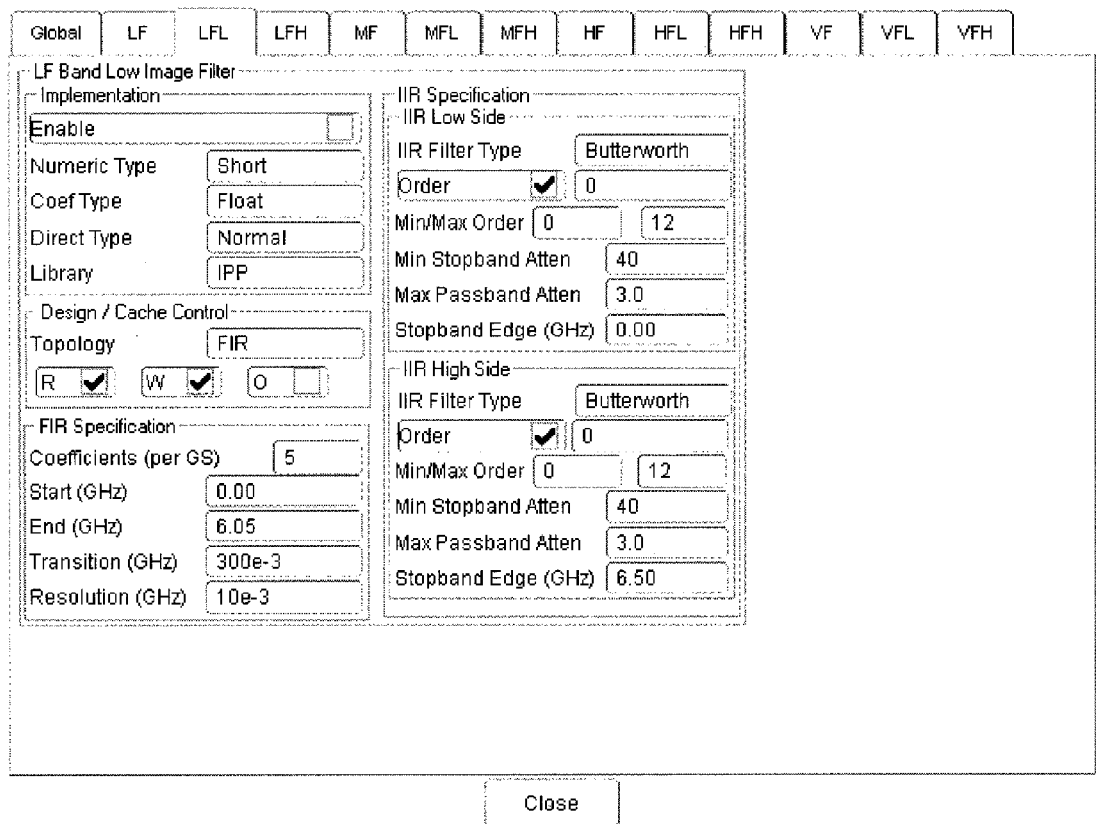
Figure 17 – Digital System LF Low Image Filter Settings Page

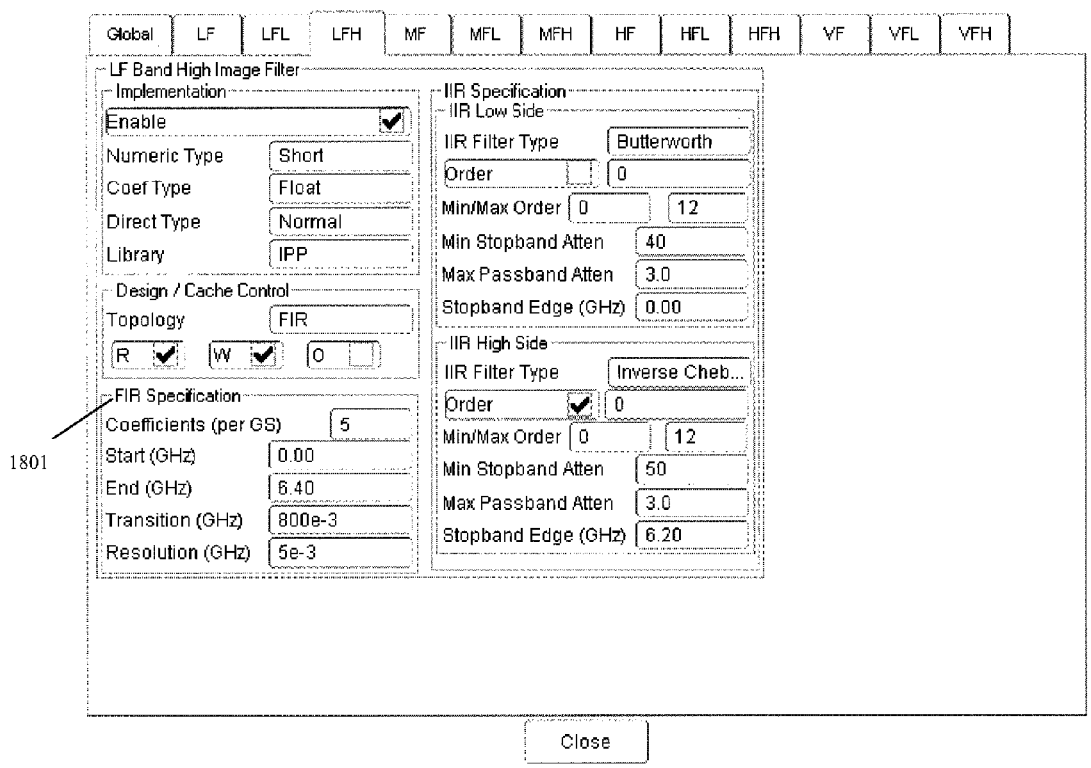
Figure 18 – Digital System LF High Image Filter Settings Page

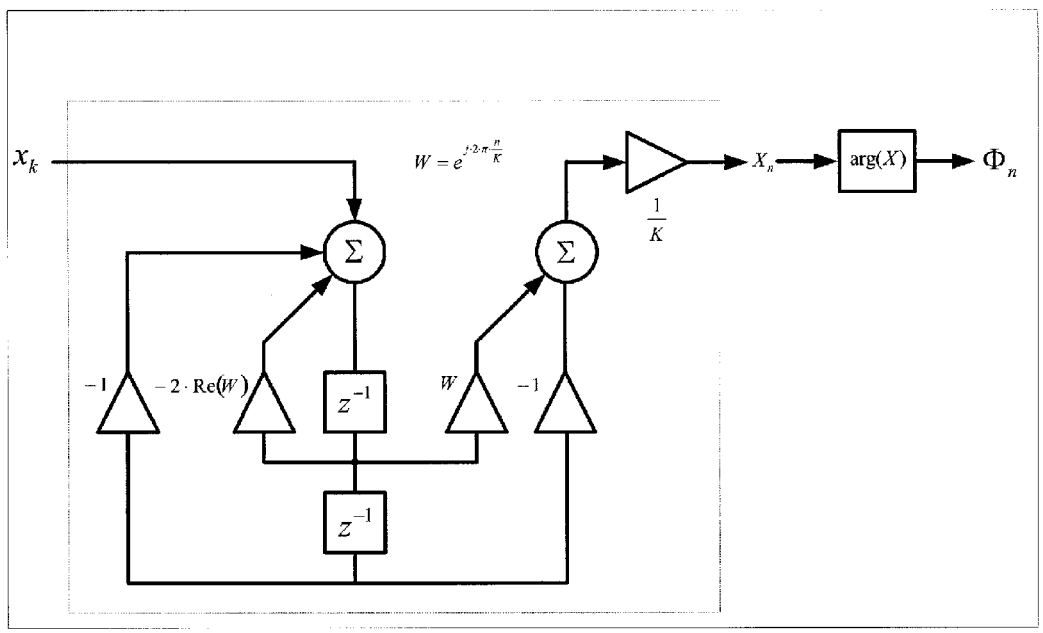
Figure 19 – Reference Tone Phase Detection Using the Goertzel Algorithm

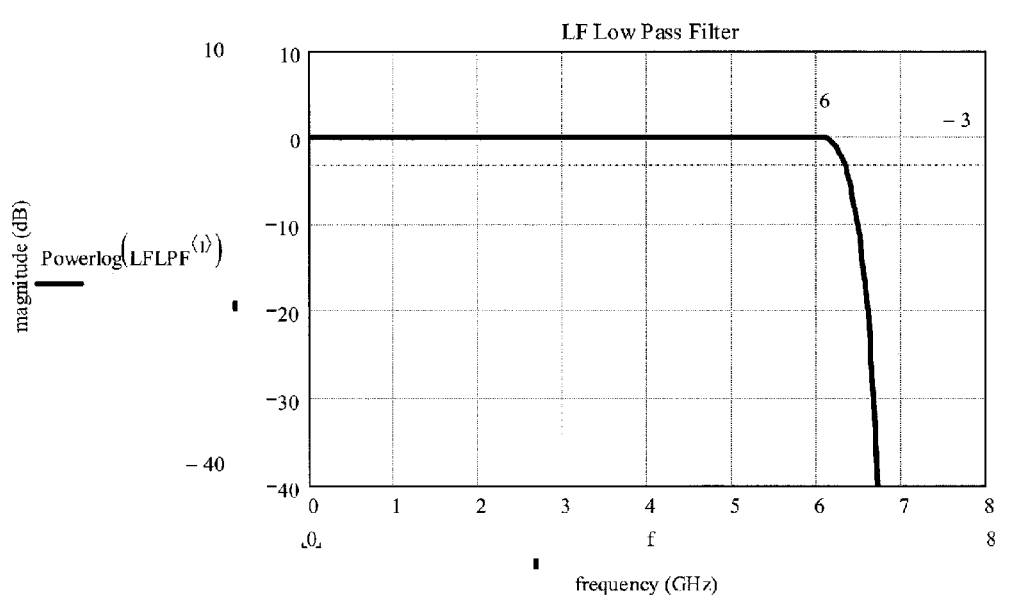
Figure 20 – LF Low Pass Filter Response
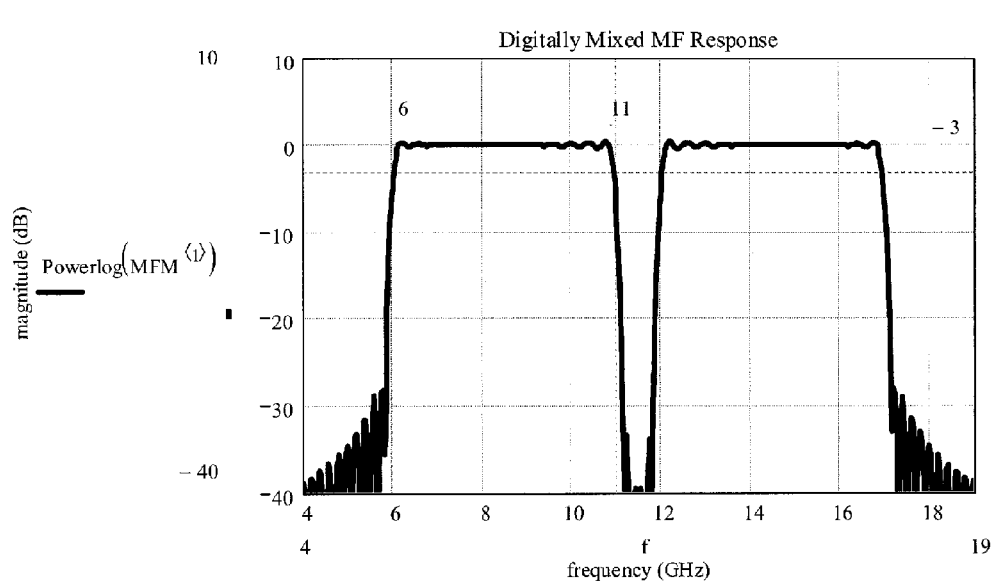
Figure 21 – MF Response after Mixer

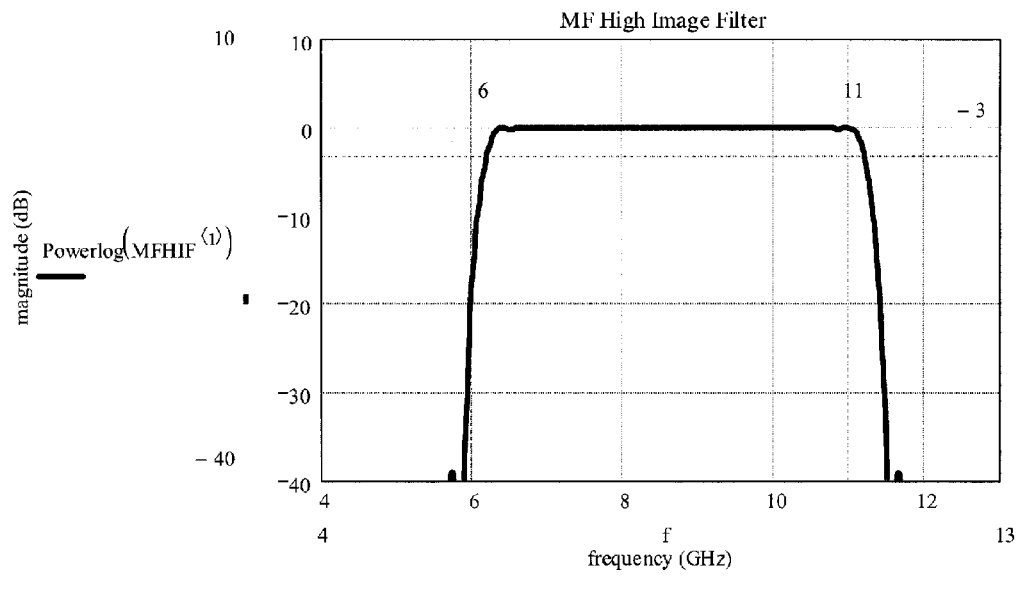
Figure 22 – MF High Image Filter Response
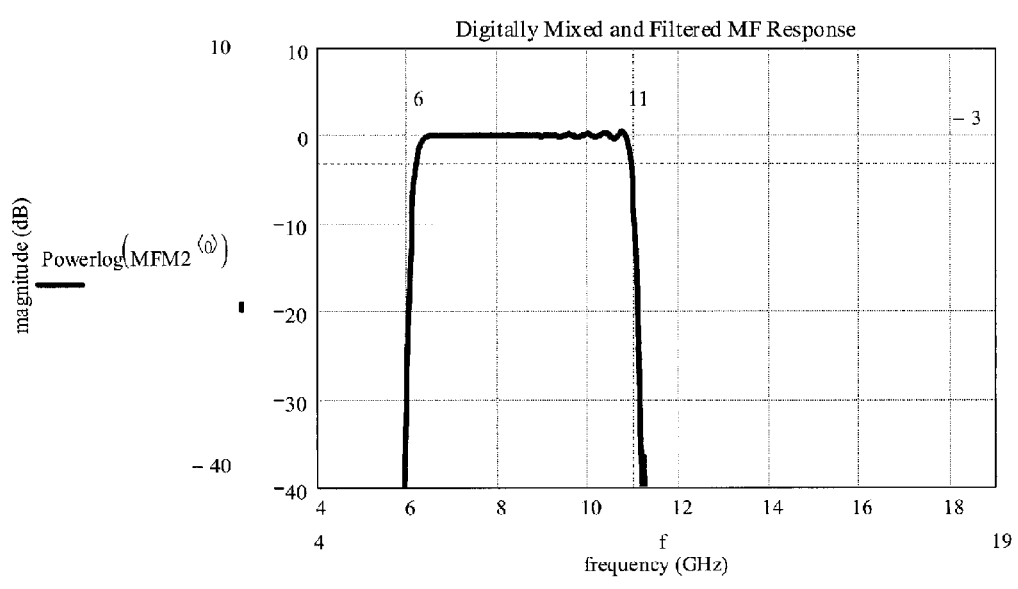
Figure 23 – MF Path Final Response

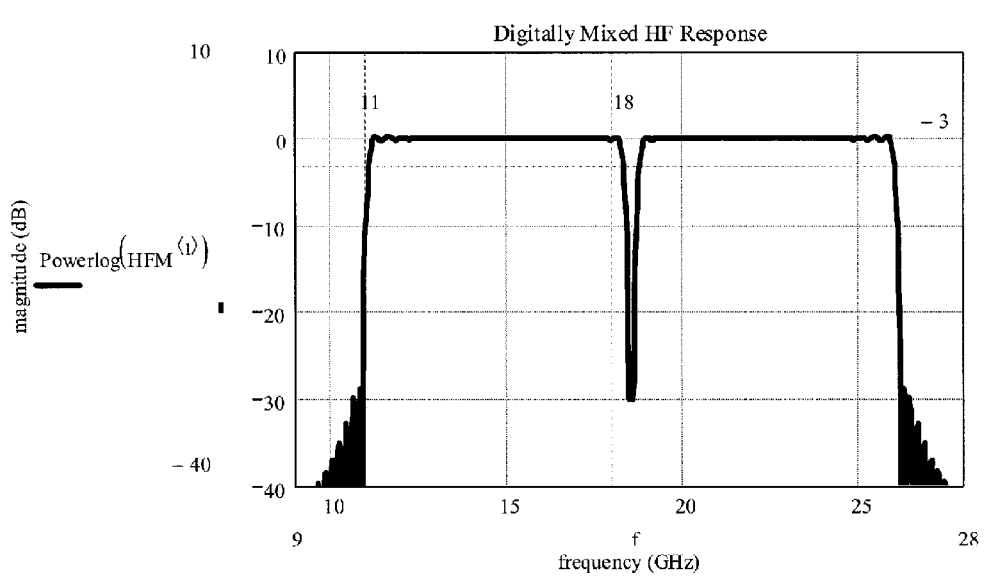
Figure 24 – HF Response after Mixer
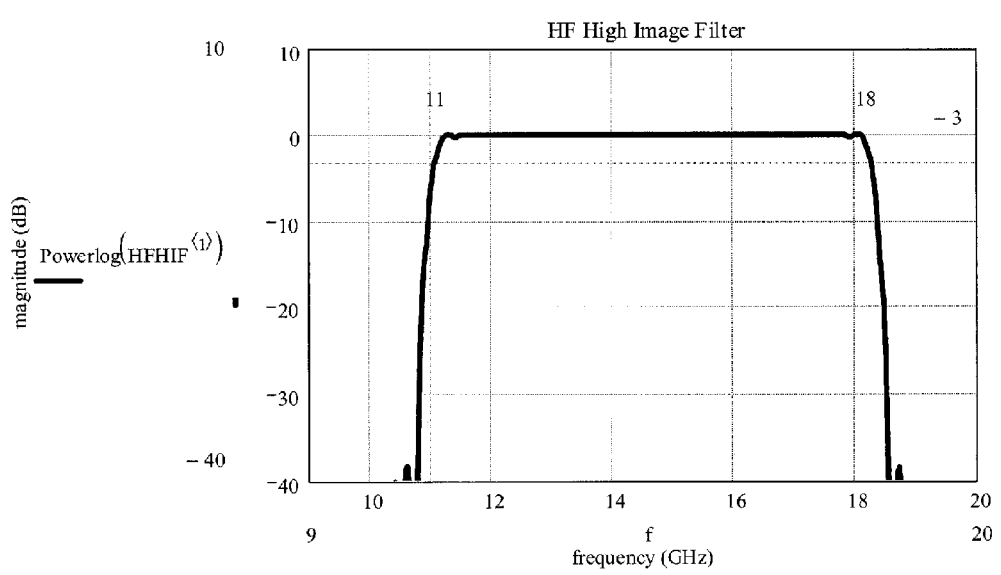
Figure 25 – HF High Image Filter Response

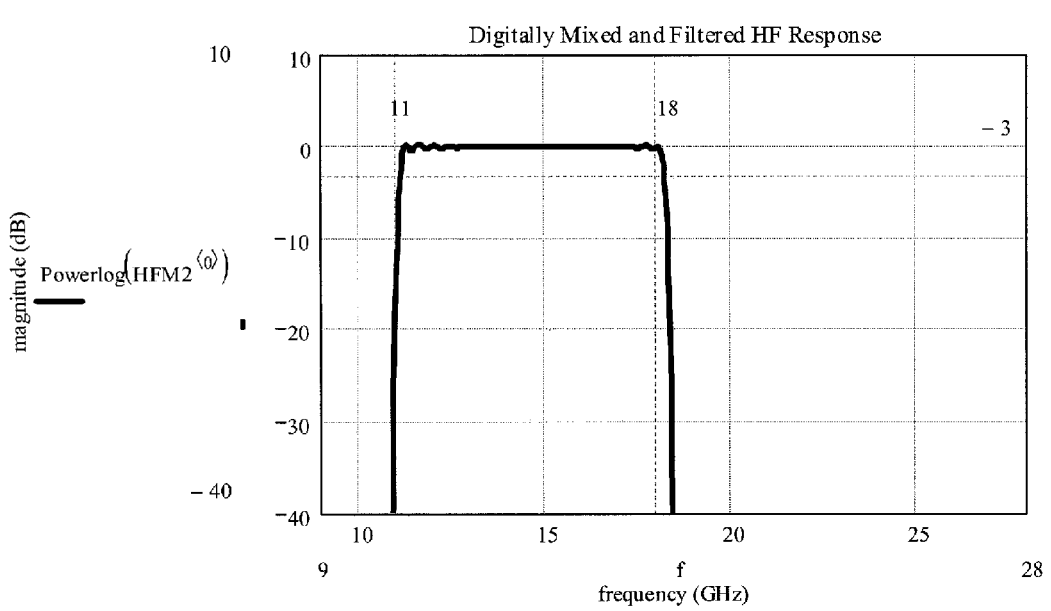
Figure 26 – HF Path Final Response
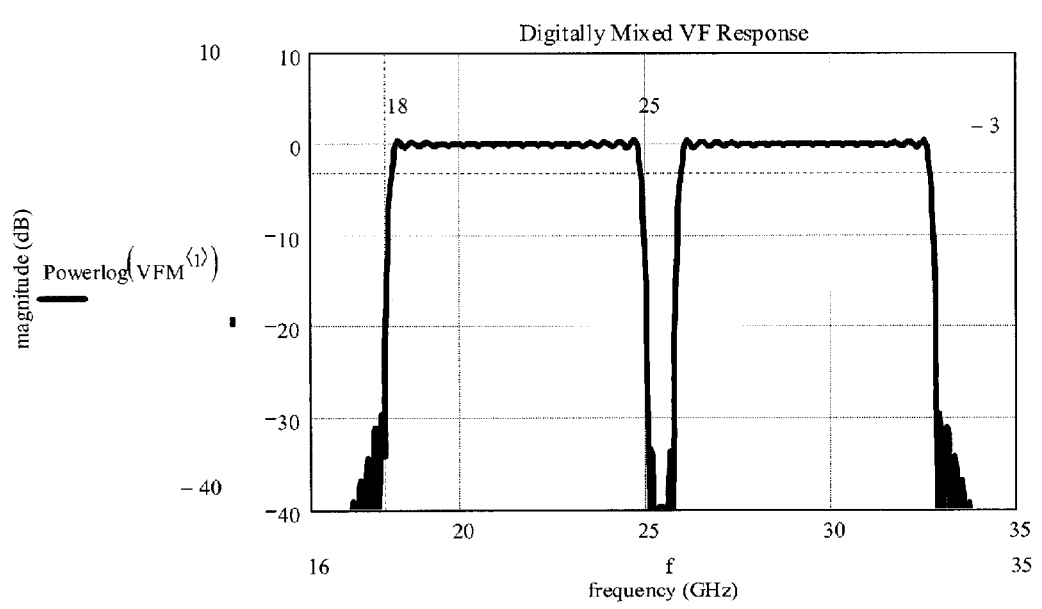
Figure 27 – VF Response after Mixer

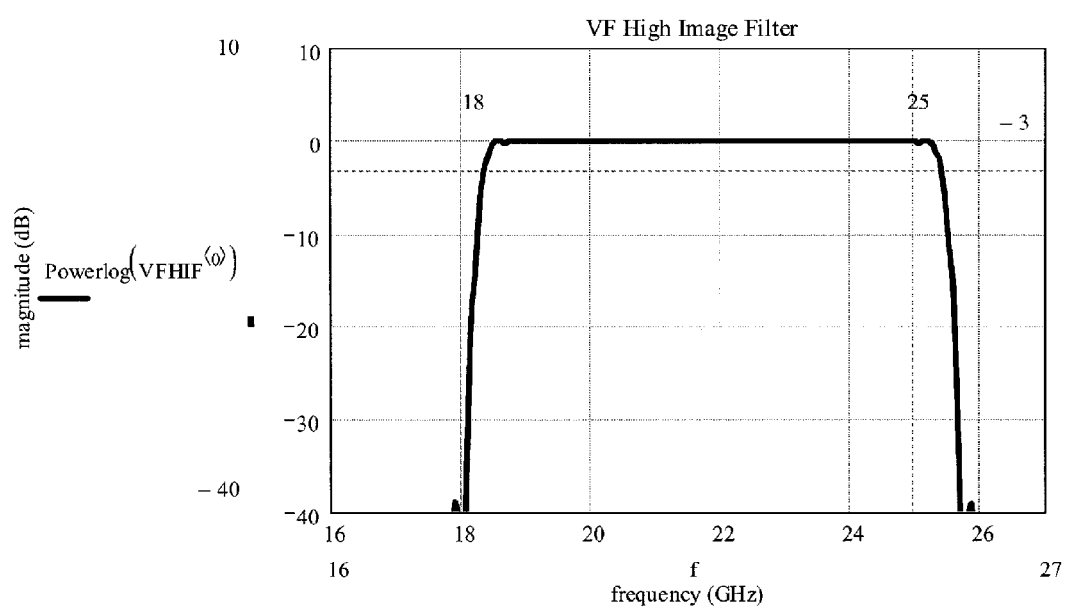
Figure 28 – VF High Image Filter Response
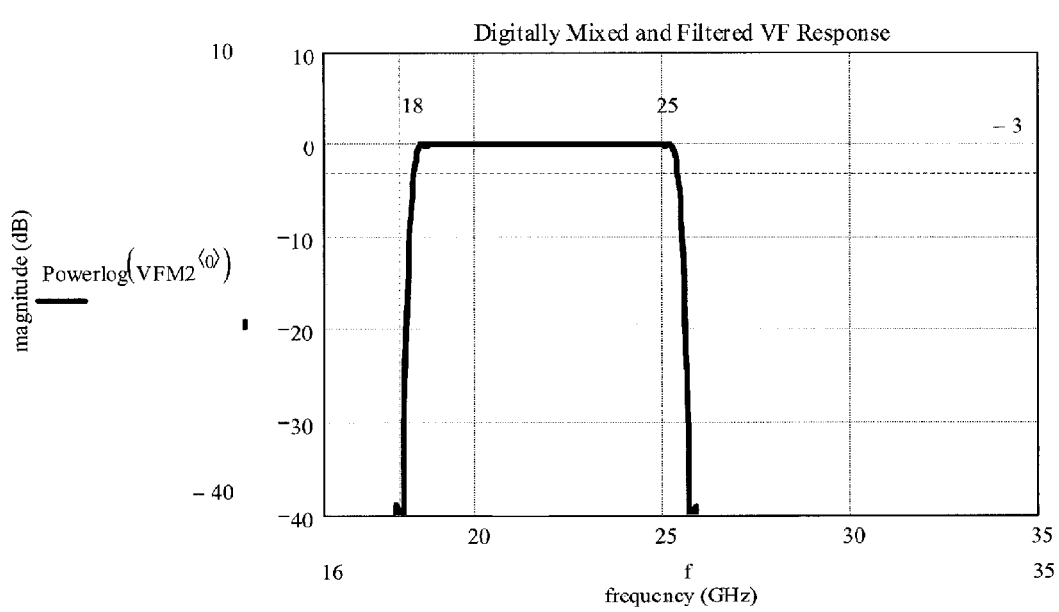
Figure 29 – VF Path Final Response

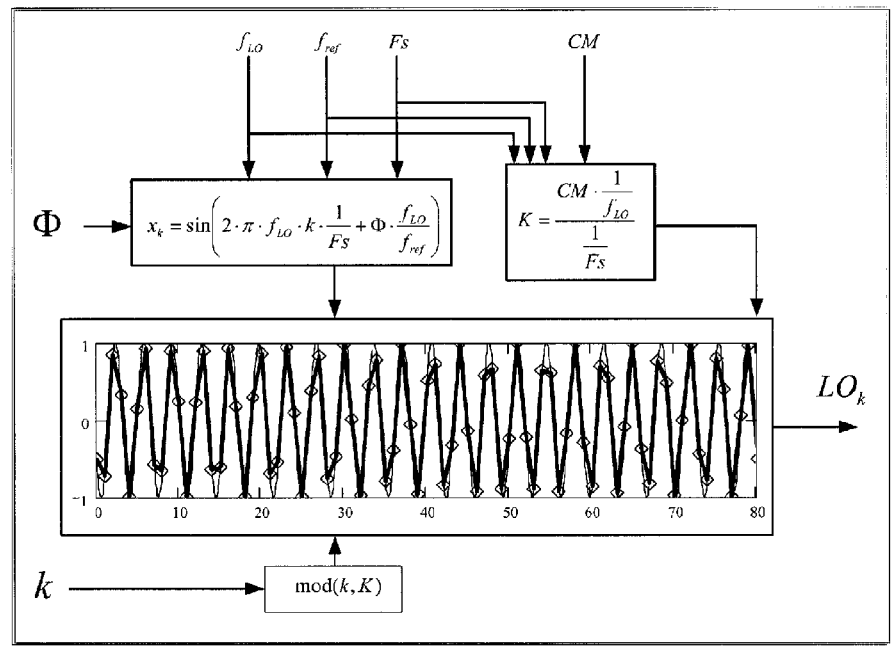
Figure 30 – Digital LO Generator
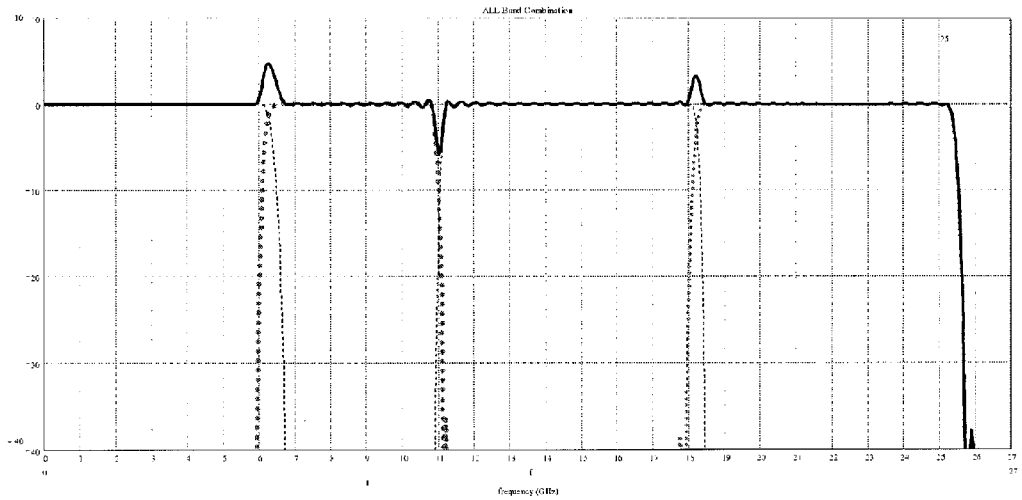
Figure 31 – LF, MF, HF and VF Band Combination

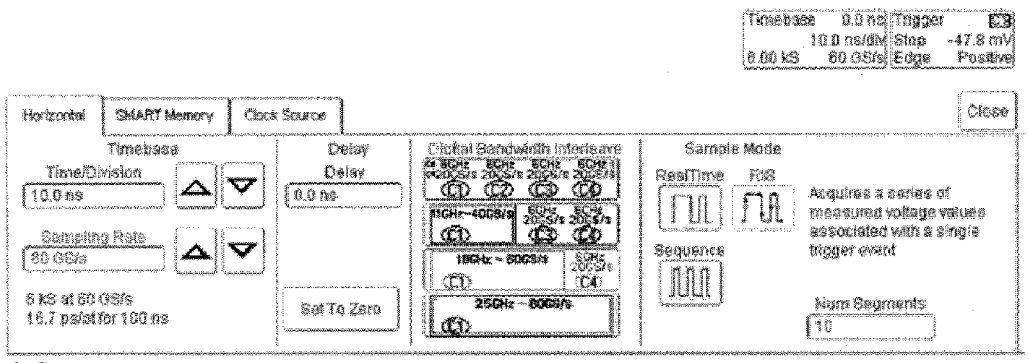
Figure 32 – DSO Screen Image Showing DBI Mode Selection Menu
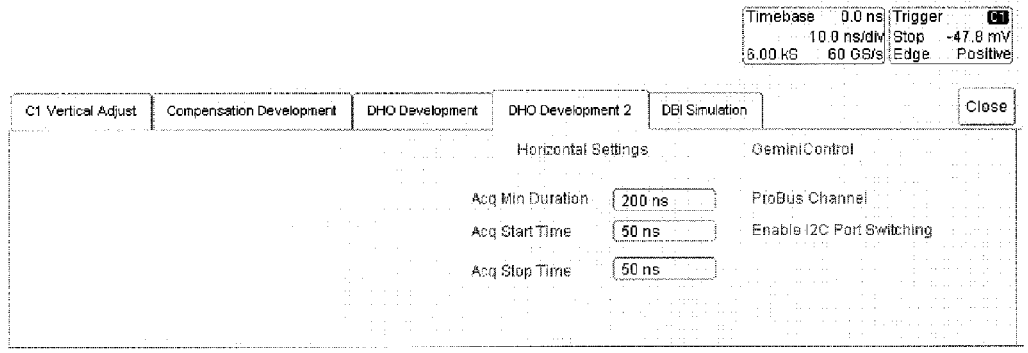
Figure 33 – DSO Screen Image Fragment Showing DBI Internal Acquisition Settings
Figure 34 - DSO Screen Image Fragment Showing DBI Calibration

METHOD AND APPARATUS FOR A HIGH BANDWIDTH OSCILLOSCOPE UTILIZING MULTIPLE CHANNEL DIGITAL BANDWIDTH INTERLEAVING

CROSS-REFERENCE TO RELATED APPLICATIONS

This application claims the benefit under of U.S. Provisional Patent Application Ser. No. 60/927,091 filed May 1, 2007 titled "OSCILLOSCOPE" the contents thereof being incorporated herein by reference. This application is also a Continuation-In-Part application of U.S. patent application Ser. No. 12/102,946 filed Apr. 15, 2008 titled "High Bandwidth Oscilloscope for Digitizing an Analog Signal Having a Bandwidth Greater than the Bandwidth of Digitizing Components of the Oscilloscope", now U.S. Pat. No. 7,653,514 which is a continuation of U.S. patent application Ser. No. 11/729,606, filed Mar. 29, 2007 by Peter Pupalaikis et al., entitled "High Bandwidth Oscilloscope", now U.S. Pat. No. 7,373,281, which in turn is a continuation application of U.S. patent application Ser. No. 11/281,075, filed Nov. 17, 2005 by Peter Pupalaikis et al., entitled "High Bandwidth Oscilloscope", now U.S. Pat. No. 7,219,037. The '037 patent in turn claims the benefit of i) U.S. Provisional Patent Application 60/629,050, filed Nov. 18, 2004 by Pupalaikis and entitled "High Bandwidth Oscilloscope," ii) U.S. Provisional Patent Application 60/656,865, filed Feb. 25, 2005 by Pupalaikis et al. and entitled "The Digital Heterodyning Oscilloscope," and iii) U.S. Provisional Patent Application 60/656,616, filed Feb. 25, 2005 by Mueller et al. and entitled "Method and Apparatus for Spurious Tone Reduction in Systems of Mismatched Interleaved Digitizers." The '037 patent is also a continuation-in-part of U.S. patent application Ser. No. 10/693,188, filed Oct. 24, 2003 by Pupalaikis et al. and entitled "High Bandwidth Real Time Oscilloscope," now U.S. Pat. No. 7,058,548, which claims the benefit of U.S. Provisional Patent Application 60/420,937, filed Oct. 24, 2002 by Pupalaikis et al. and entitled "High Bandwidth Real Time Oscilloscope."

FIELD OF THE INVENTION

The present invention relates to a high bandwidth digital storage oscilloscope (DSO) design that incorporates heterodyning or other combination of multiple acquisition channels to increase the bandwidth of a traditional oscilloscope design.

BACKGROUND OF THE INVENTION

A real-time digital storage oscilloscope (DSO) is one of the primary tools of engineers in the development of all kinds of electronic items. A high-bandwidth DSO is of particular use in the development of newer and faster items because the performance of the DSO must be higher than that of the electronic items in development. Thus, as the speed of various electronic items increases, so does the need for ever higher bandwidth DSOs. In an age of rapid speed increases of electronics, a high bandwidth oscilloscope is needed that can be developed and deployed quickly.

These desired increases in DSO performance produce a dilemma because the bandwidth of the DSO is mostly related to the speed of the front-end amplifiers and analog-to-digital converters (ADCs) used therein. These components are traditionally designed using custom application specific integrated circuits (ASICs). These ASICs, in turn, must be built utilizing the highest performance integrated circuit (IC) design processes available. Their development along with the design and development of the rest of the DSO must be designed in time for the DSO to be utilized for design and development activities utilizing chips designed with these fast processes. In other words, the DSO is preferably built in and using the same processes as the chips that the DSO is designed to test.

a. The fastest IC design processes are expensive and difficult to utilize when they are first introduced, especially for low volume IC production. Also, while new IC design processes tend to be optimized for digital IC development (such as the development of faster computers, serial data links, etc.), DSO front-end designs in particular utilize analog ICs.

ASIC development has been becoming increasingly expensive, almost to a point whereby the huge development costs cannot be recaptured in a relatively low volume production area, such as the oscilloscope market.

Additionally, the development time for higher performance ASICs and the supporting hardware can be prohibitively long and cumbersome which can extensively delay the time to market for a product. As has been determined by the inventors of the present invention, as well as of by the inventors of the applications and patents to which this application claims priority and benefit, by using multiple channel combining through the digital bandwidth interleaving method with previously developed and deployed hardware, the time to market for a new higher performance oscilloscope can be significantly reduced.

OBJECTS OF THE INVENTION

It is an object of this invention to provide a high bandwidth real-time oscilloscope design that provides for large increases in oscilloscope bandwidth.

It is another object of this invention to provide a method that combines a plurality of channel resources to multiply not only sample rate and memory length, but also bandwidth.

It is a further object of this invention to provide for all of these benefits while simultaneously providing good specifications regarding signal fidelity including:
  Wide input dynamic range.
  High signal-to-noise ratio (SNR).
  Low signal distortion.
  High effective number of bits (ENOB).
  Good input return loss.
  Good magnitude response flatness
  Good time domain performance including low overshoot and preshoot.

It is yet another object of the invention to provide a high bandwidth real-time oscilloscope that overcomes the drawbacks of current real-time oscilloscopes.

Still other objects and advantages of the invention will in part be obvious and will in part be apparent from the specification and the drawings.

SUMMARY OF THE INVENTION

FIG. 1 shows a (Digital Bandwidth Interleaved) DBI enabled oscilloscope constructed in accordance with an embodiment of the invention. Normally, in a non DBI enabled oscilloscope, four input channels CH1 [100], CH2 [101], CH3 [102], and CH4 enter an oscilloscope, such as a LeCroy® WaveMaster® 8620A DSO and are connected to the inputs to each of four front-end amplifiers [105], [106], [107], and [108]. In particular, an oscilloscope such as the 8620A is designed to digitize waveforms at sample rates of up to 20 GS/s at bandwidths up to 6 GHz into memories up to 50 Mpoints long. These are the banner specifications of the 8620A.

When DBI operation is enabled, up to four channels can be grouped together to form a single high bandwidth channel, or a number of higher bandwidth channels, or other combinations as desired. This operation enables the instrument to acquire and display a signal with higher frequency content than a single non-DBI enabled channel. The process of channel combination involves splitting an input signal into multiple frequency bands, translating at least on of these bands to lower frequency bands through downconversion, and acquiring each band with independent analog-to-digital converters (ADCs). Each translated band is then digitally upsampled, upconverted, and finally summed together in its original phase relationship which will thereby create an accurate representation of the original input waveform.

The channel 1 input of the oscilloscope may be connected to a frequency multiplexer. The purpose of the multiplexer is to split the input signal into more than one frequency band, preferably in an exemplary embodiment, four frequency bands which are placed at four outputs of the multiplexer. In the particular exemplary embodiment described above, these four frequency bands are approximately delimited by frequency boundaries of DC to 6 GHz, 6 GHz to 11 GHz, 11 GHz to 18 GHz, and 18 GHz to 25 GHz, herein designated as the LF, MF, HF, and VF band respectively. The LF band output of the multiplexer is connected to the CH1 front end amplifier. The MF, HF, and VF band outputs of the multiplexer are connected to their respective band's downconverter. The purpose of the downconverter is to translate high radio frequency (RF) content to lower intermediate frequency (IF) content so that they will land within the passband of the analog-to-digital converters (ADC) input. The outputs of the MF, HF, and VF band downconverters are connected to the input of a programmable solid-state input selector switch on the CH2, CH3, and CH4 ADC, respectively. In the non-DBI enabled mode of operation, the ADC input selector switch is connected to the oscilloscope input via a 6 GHz front-end amplifier. However, when DBI operation is enabled the ADC input selector switch is connected to the output of its respective downconverter thereby enabling channel combination. One additional benefit of this switching scheme is that it potentially leaves the channel whose ADC is used to receive a downconverted band with a front-end amplifier available for triggering function.

The oscilloscope preferably acquires the LF, MF, HF, and VF frequency bands simultaneously, but may be acquired consecutively or at any other desired timing relationship as appropriate. During waveform processing by the instrument software the MF, HF, and VF bands are translated back to their original locations at approximately 6 GHz to 11 GHz, 11 GHz to 18 GHz, and 18 GHz to 25 GHz, respectively, after which the LF, MF, HF, and VF bands are recombined to form a 25 GHz bandwidth acquisition. During this processing, each band is upsampled resulting in a quadrupling of base sample rate and since four channels are utilized, quadrupling of the sample memory length is also realized. The most important result, however, is a more than quadrupling of a single non-DBI channel's bandwidth.

The invention accordingly comprises the several steps and the relation of one or more of such steps with respect to each of the others, and the apparatus embodying features of construction, combinations of elements and arrangement of parts that are adapted to effect such steps, all as exemplified in the following detailed disclosure, and the oscilloscope of the invention will be indicated in the claims.

BRIEF DESCRIPTION OF DRAWINGS

For a more complete understanding of the invention, reference is made to the following description and accompanying drawings, in which:

FIG. 1 is a block diagram showing the splitting of an input signal for DBI operation and the switching of DBI hardware outputs with the non-DBI signals passing to an Analog to Digital Converter (ADC) in accordance with a preferred embodiment of the invention;

FIG. 2 is a block diagram showing the downconversion scheme for a grouping of up to four channels in accordance with the preferred embodiment of the invention;

FIG. 3 is a plot of the power levels applied to each stage within the MF band downconverter in accordance with the preferred embodiment of the invention;

FIG. 4 is a plot of the power levels applied to each stage within the HF band downconverter in accordance with the preferred embodiment of the invention;

FIG. 5 is a plot of the power levels applied to each stage within the VF band downconverter in accordance with the preferred embodiment of the invention;

FIG. 6 is a plot of the accumulated gain relative to the input for each stage within the MF band downconverter in accordance with the preferred embodiment of the invention;

FIG. 7 is a plot of the accumulated gain relative to the input for each stage within the HF band downconverter in accordance with the preferred embodiment of the invention;

FIG. 8 is a plot of the accumulated gain relative to the input for each stage within the VF band downconverter in accordance with the preferred embodiment of the invention;

FIG. 9 is a diagram showing the organization of the circular memory buffer within the oscilloscope in accordance with the preferred embodiment of the invention;

FIG. 10 is a plot showing the digital LO generator when using an LO multiplication scheme for LO generation in accordance with the preferred embodiment of the invention;

FIG. 11 is a plot showing the delay calibration clocks that are injected into the IF section of each downconverter used to perform the ADC delay calibration in accordance with the preferred embodiment of the invention;

FIG. 12 is a graphic showing all the channel grouping combinations within this DBI enabled oscilloscope in accordance with the preferred embodiment of the invention;

FIG. 13 is a block diagram representation of a DBI processor configuration inside the processing web internal to the WaveMaster 8620A DSO in accordance with the preferred embodiment of the invention;

FIG. 14 is a block diagram representation of a digital signal processing (DSP) system that processes the LF, MF, HF, and VF waveforms acquired by a DBI equipped oscilloscope and produces the DBI output waveform in accordance with the preferred embodiment of the invention;

FIG. 15 is a representation of an internal configuration menu of DBI DSP system settings that apply to all bands in accordance with the preferred embodiment of the invention;

FIG. 16 is a representation of an internal configuration menu of DBI DSP system settings for the LF band signal recovery menu in accordance with the preferred embodiment of the invention;

FIG. 17 is a representation of an internal configuration menu of DBI DSP system settings for the LF band signal low image filtering menu in accordance with the preferred embodiment of the invention;

FIG. 18 is a representation of an internal configuration menu of DBI DSP system settings for the LF band signal high image filtering menu in accordance with the preferred embodiment of the invention;

FIG. 19 is a block diagram representation of how the phase of the reference tone is calculated utilizing the Goertzel algorithm in accordance with the preferred embodiment of the invention;

FIG. 20 is a graphical representation of the low frequency (LF) low pass (LP) filter magnitude response in accordance with the preferred embodiment of the invention;

FIG. 21 is a graphical representation of the digitally mixed combination of the MF low image showing the multiple images created by the mixing action in accordance with the preferred embodiment of the invention;

FIG. 22 is a graphical representation of the MF high image filter magnitude response in accordance with the preferred embodiment of the invention;

FIG. 23 is a graphical representation of the result of application of the MF high image filter to the digitally mixed MF low image which forms the overall MF digital filter response in accordance with the preferred embodiment of the invention;

FIG. 24 is a graphical representation of the digitally mixed combination of the HF low image showing the multiple images created by the mixing action in accordance with the preferred embodiment of the invention;

FIG. 25 is a graphical representation of the HF high image filter magnitude response in accordance with the preferred embodiment of the invention;

FIG. 26 is a graphical representation of the result of application of the HF high image filter to the digitally mixed HF low image which forms the overall HF digital filter response in accordance with the preferred embodiment of the invention;

FIG. 27 is a graphical representation of the digitally mixed combination of the VF low image showing the multiple images created by the mixing action in accordance with the preferred embodiment of the invention;

FIG. 28 is a graphical representation of the VF high image filter magnitude response in accordance with the preferred embodiment of the invention;

FIG. 29 is a graphical representation of the result of application of the VF high image filter to the digitally mixed VF low image which forms the overall VF digital filter response in accordance with the preferred embodiment of the invention;

FIG. 30 is a representation of a digital LO tone generator in accordance with the preferred embodiment of the invention;

FIG. 31 is a graphical representation of the LF, MF, HF, and VF path digital filter response along with the resulting response as a result of the digital recombination showing a vertical zoom that enhances the view of the magnitude response flatness in accordance with the preferred embodiment of the invention;

FIG. 32 shows a DSO oscilloscope screen showing the horizontal settings menu with the user selections for utilizing each of groups of four channels for either quad 6 GHz operation or single 25 GHz operation and all combinations in between in accordance with the preferred embodiment of the invention;

FIG. 33 shows a DSO oscilloscope screen fragment showing the internal DBI acquisition configuration in accordance with the preferred embodiment of the invention; and FIG. 34 shows a DSO oscilloscope screen fragment showing the DBI calibration items MF, HF, and VF delay, Variable Gain and Attenuation for each Volt/div (vdiv) setting and band in accordance with the preferred embodiment of the invention.

DETAILED DESCRIPTION OF THE PREFERRED EMBODIMENTS

FIG. 1 shows a block diagram of a DBI enabled oscilloscope constructed in accordance with a preferred embodiment of the invention. This diagram shows a single channel DBI implementation. In this preferred implementation, oscilloscope channels 1 [101], 2 [102], 3 [103], and 4 [104] can be selectively grouped together in a sequential order to form a single high bandwidth channel. A user can operate the oscilloscope in a non-combined configuration with four independent 6 GHz channels or can combine up to four channels into a single 25 GHz channel. There are other selectable grouping schemes where the user can choose two 6 GHz channels and one 11 GHz channel that is created by grouping channels 1 and 2, or one 6 GHz channel and one 18 GHz channel that is created by grouping channels 1, 2, and 3. While not particularly shown, two 11 GHZ channels may also be selected by a user. These channel groupings are illustrated in FIG. 12. For the most general discussion, the implementation of the maximum bandwidth configuration with all four channels combined will be described with the understanding that the removal of a channel from a grouping is a subset of the overall implementation. Additionally, any description of a particular hardware element should be considered to be by way of example only. It should be understood that other components or elements that are known in the art to perform similar jobs, or provide similar results may be substituted in the described implementation and should therefore be considered as part of the present invention.

One of the cornerstones of this method is the splitting of the input frequency spectrum into smaller spectral bands which will be downconverted and then reassembled further in the signal processing chain. Before discussing the specific implementation of this method, a few definitions relating to the divided spectral bands are needed that will be referred to throughout the remainder of the discussion. Frequency bands are approximately delimited with the following frequency boundaries: DC to 6 GHz, 6 GHz to 11 GHz, 11 GHz to 18 GHz, and 18 GHz to 25 GHz. These bands are designated as the LF, MF, HF, and VF bands respectively. These designators will be used throughout the following discussion.

FIG. 1 depicts the CH1 input [100] connected to a frequency diplexer [110]. The purpose of the diplexer is to split the signal into two frequency bands, one with frequency content from DC to 18 GHz which will be split further, and another from 18 GHz to 25 GHz which forms the VF band. The VF output of the diplexer is connected directly to the input of the VF downconverter [123]. The other output of the diplexer [110] is connected to a second diplexer [115]. The second diplexer again splits the input frequency content into two bands, one with frequency content between DC to 6 GHz, which forms the LF band, and another between 6 GHz to 18 GHz which will be split further. The LF band output is connected to the front-end amplifier [105] of the oscilloscope whose output is connected to the ADC where the LF signal is acquired [125]. In this implementation, the cascade of the two diplexers is grouped together within a single module called a triplexer which is shown in FIG. 2.

In FIG. 1 the output of the second diplexer [115] with frequency content between 6 GHz to 18 GHz may be connected to a Wilkinson power divider [130], or simply referred to as a Wilkinson. The purpose of the Wilkinson is to create two copies of the input signal each with a nominal power level that is 3 dB lower than the input power level. The frequency content of both outputs of the Wilkinson has the same 6 GHz to 18 GHz frequency content as the input and one output is connected to the MF band downconverter [121] and the other output is connected to the HF band downconverter [122]. There are other alternatives to using a Wilkinson to provide these two outputs, such as a resistive power splitter or another diplexer. Each method of splitting the signal implies various tradeoffs that those skilled in the art would be able to identify.

As mentioned above, the implementation allows for selective enabling of DBI channel groupings depending on the maximum acquisition bandwidth that the user wants. Selection is accomplished by using solid-state multiplexing circuits (MUXs) whose selection state is controlled by software programmable registers. The MUX for the MF, HF, and VF, band are shown in FIG. 1 as [140], [141], and [142] respectively. One MUX input of each channel is connected to an output of each downconverter [121], [122], and [123]. Each channel's respective direct, non-downconverted input [101], [102], and [103] goes through Front End amplifiers [106], [107], and [108]. Each channel's respective front end amplifier output is then connected to the other input of each MUX. A channel's MUX state can then be programmed to either select a downconverted signal or a non-downconverted signal to be acquired by an ADC. In this embodiment, DBI can only be enabled by sequentially combining channels, however, the limitations of sequentially enabling channels can be overcome with an alternate, more complex multiplexing topology.

A detailed description of the implementation of the downconverter sections follows and is depicted in the block diagram shown in FIG. 2. The primary purpose of a downconverter in this invention is to take high frequency content, commonly known as RF content, and translate it to relatively lower frequency band known as IF band such that IF frequency content falls within the passband of the ADC. The secondary purpose of the downconverter in this invention is to match the nominal power level of the input signal to the acceptable nominal input power level of the ADC. The nominal input power level ranges from −18 dBm to +22 dBm whereas the nominal acceptable input power level of the ADC is fixed at −4 dBm. These two functions are discussed below The downconverter is comprised of a chain of multiple components. First an overview of the components in the downconverter chain is given followed by a detailed description of each component's functions and design.

In FIG. 2, the signal designated as the MF exits the Wilkinson divider [201] with 6 GHz to 18 GHz of frequency content. This signal travels through a fixed 4 dB front end attenuator [202], commonly referred to as a pad, which is connected to a programmable digital step attenuator [204]. The output of the attenuator is connected to a low noise amplifier (LNA) [206]. The LNA is connected to a fixed 2 dB pad [208]. The 2 dB pad is connected to a band pass filter [210], herein referred to as a band filter, with a passband approximately from 6 GHz to 11 GHz. The output of the band filter is connected to a variable voltage attenuator (VVA) [212] which is designed to provide between 0-4 dB of attenuation is 0.001 dB increments. The output of the VVA is connected to a second LNA [214] with 15 dB of gain and the output of the LNA is connected to a 3 dB pad [216]. The output of the 3 dB pad runs to the RF input port of a mixer [218]. The cascade of components described above comprises the RF chain for the MF band.

The mixer requires a local oscillator (LO) frequency tone which is generated by a dielectric resonant oscillator (DRO) [220] that is applied to the LO input port of the mixer. The DRO receives a reference signal from the ADC called SyncOut [221] and multiplies it up to the frequency of the LO tone. Before reaching the mixer, a portion of the LO tone is coupled to the input of a clock divider [224] via a 20 dB directional coupler [222]. The clock divider creates a tone at half the frequency of the LO with a fixed phase relationship to the LO. This divided frequency is often referred to as a pilot tone. After mixing the input frequency band with the LO tone, the output of the mixer has desired frequency content approximately between 0.46 GHz and 5.46 GHz. The output of the mixer passes through a 3 dB pad [226] and then a second directional coupler [228]. The pilot tone is coupled into the output of the mixer via the coupled arm of the second directional coupler [228] so that the output of this second directional coupler has the downconverted frequency content and the pilot tone. The combination of these two components is considered the intermediate frequency (IF) band. The IF band will also have unwanted spurious components, such as LO feedthrough and distortion products, that must be rejected by downstream components.

The IF band enters an IF signal conditioning module [230] comprised of a cascade of components. The first component of the IF module is a diplexer [232]. The diplexer takes the IF frequency content and splits it into two bands, one with frequency content approximately less than 10 GHz and one with frequency content approximately greater than 10 GHz. The frequency content above 10 GHz is undesirable and is terminated by a termination network [234] while the frequency content below 10 GHz is passed to an IF amplifier [236]. The output of the IF amplifier is connected to a stub [238] tuned to the LO frequency that will shunt out practically all remnants of the LO tone that might have leaked into the IF band. The output of the LO stub is connected to a power amplifier [240] with nominally 16.5 dB of gain. The output of the power amplifier is connected to a programmable PIN diode SPDT switch [242]. In normal operational mode, the PIN diode switch passes the signal to bias tee [244]. The output of the bias tee is applied to a voltage limiter [246] whose output is connected to a resistive power splitter [248] that creates two copies of the IF signal that each with nominal power 8 dB less than the power level at the input of the divider. Each output of the resistive divider is applied to the two inputs of the CH2 ADC [250] where the IF signal is digitized. The components described in the paragraph above comprise the IF chain.

A summary of the cascaded stages, where each stage is composed of one or more of the components described above, is presented in Table 1. The stage number designators correspond to the stage number designators in FIGS. 3, 4, 5, 6, 7 and 8. As previously mentioned, one purpose of the downconverter is to normalize the power level of the input ranging from +22 dBm to −18 dBm to −4 dBm which is the nominal full scale range of the ADC. FIG. 3 shows how the signal power in the MF band varies as the signal travels through each stage. Similarly, FIG. 4 shows the signal power level for the HF band through each stage in the chain and FIG. 5 shows the signal power level for the VF band for each stage in the chain. The cumulative gain that has been applied to the signal at each point in the signal processing chain for the MF, HF, and VF bands is shown in FIGS. 6, 7, and 8 respectively.

TABLE 1

Summary of cascaded components

| Stage Number Designator | Description |
| --- | --- |
| 0 | input |
| 1 | diplexer/divider |
| 2 | fe pad |
| 3 | digital attenuator |
| 4 | LNA 1 |
| 5 | pad |
| 6 | band filter |
| 7 | VVA |
| 8 | LNA 2 |
| 9 | pad |
| 10 | mixer CL |
| 11 | pad |
| 12 | diplexer/filter |
| 13 | IF Amp |
| 14 | LO Filter and pad |
| 15 | power amp |
| 16 | switch/bias tee/limiter |
| 17 | splitter |

The function and design constraints of each of the components described above will now be discussed. The front end 4 dB pad [202] is needed to reduce the signal power before the following stage to prevent clipping of the peak voltage. The programmable digital step attenuator [204] is designed to provide 0-30 dB of attenuation in 5 dB increments. The specific programming depends on the oscilloscope's vertical scale setting selected by the user from the user interface. It is designed to coarsely match the input signal power level to an acceptable power level that can be handled by the first LNA [206].

The typical input power level for the first LNA is approximately −30 dBm. The first LNA buffers the input before it is filtered by the band filter [210] by providing isolation from reflections caused by downstream components. For instance, the band filter will reflect power that is in its stop band and it is desirable to isolate this reflected power from the input and other downconverters within a channel grouping. In addition to applying gain to the signal, the LNA also amplifies the input signal by approximately 15 dB.

The 2 dB pad following the attenuator [208] serves to improve the output reflection coefficient of the first LNA which will attenuate reflections between the band filter and the LNA output. The value of this pad can be chosen to be much higher to attenuate reflections, which can improve frequency response flatness, however additional attenuation will require more gain in the LNA which is not always desirable.

The band filter plays an important role in this design. The band filter is intended to pass RF frequencies that are in the MF passband and reject all other frequencies. It is widely know to those skilled in the art that it is critical to reject frequencies that are greater than the LO frequency. Otherwise, after passing through the mixer, these image frequencies will alias back into the IF band where they cannot be distinguished from desired frequency content and will corrupt the recovered single content. They will typically modulate the desired IF output which is undesirable in a measurement instrument. A good band filter will reject out of band components by 40 dB or better.

The VVA [212] is intended to be a fine adjustment of the nominal signal power level that appears at the output of the downconverter module. Since all of the remaining downstream components operate in a fixed gain mode, the VVA is the only way to finely tune the ultimate power level that will appear at the output of the IF module [230] and hence the input of the ADC [250].

The primary purpose of the second LNA [214] is to normalize the RF signal to the desired power that the mixer [218] should be driven. It also has the benefit of buffering the RF signal from the mixer. Typical mixers have a tendency to have poor input VSWR characteristics which will cause RF power to be reflected away from their inputs, but the LNA will provide isolation between the main input and the mixer.

At this point it should be noted that the order of the first LNA and band filter could be interchanged, however the benefit of isolation would not be realized. Also the second LNA and the VVA could have been interchanged, however the order presented is more optimal in for minimizing noise figure. Those skilled in the art of microwave circuit design should know that generally gain should be applied with low noise components before attenuation in order to minimize the apparent noise figure of the cascade. By this principle, the second LNA could have been cascaded immediately after the first LNA which might be more optimal from a noise figure however the benefit of isolation would have been lost.

Finally the last component before the mixer is a 3 dB pad [216] simply improves the mixer's apparent VSWR which will mitigate the effect of reflections caused by the mixer's inherently poor input VSWR.

The mixer takes the RF input and multiplies it with a LO tone. It has a nominal conversion loss of 9 dB. The mixer used in this design is a medium power triple balanced mixer (TBM). The required LO tone power is on the order of 20 dBm. A higher power mixer could be used which will tend to reduce the mixer's spurious response however a medium power mixer was sufficient for this design as the RF power level was sufficiently below the mixer's IP3 compression point. Other mixer topologies can be used such as the IQ image reject mixer topology; however this design did not require the benefits associated with those topologies.

The 2 dB pad [226] at the mixer output helps to improve its output impedance and mitigate the effects of standing waves created by the mixer's output impedance mismatch with the following stage. Again a higher attenuation value could have been chosen however additional gain would have been needed in the signal path.

The directional coupler located in the IF path [228] is a 30 dB coupler which means that the amount of power coupled to its thru arm is 30 dB lower than the power applied to the coupled arm. This will allow a small copy of the pilot tone to be injected into the IF band without corrupting or overriding the downconverted frequency content. Other types of couplers or power combiners can be used, such as a resistive power combiner or a Lange coupler, however their properties are not helpful in this design and a directional coupler is the preferred method of coupling the pilot tone in this design.

Before proceeding, it is useful to note that there is an alternative to using the second directional coupler [228] for injecting the pilot tone. In certain cases it might be beneficial to inject the pilot tone further down stream in the IF section to reduce intermodulation distortion or if the pilot tone frequency is outside the passband of the filters located in the IF section. To overcome these limitations, the pilot tone can be added back to the IF signal by injecting it into the Tone Inj. port [241].

The purpose of the diplexer at the input of the IF module [243] is to pass desired IF frequencies and terminate spurious frequencies produced by the RF chain and the mixer. It should also help to reject the LO feedthrough from the mixer. The desired IF frequency band is typically 0.5 GHz to 7 GHz. A good diplexer should attenuate spurious content by 30 dB or better. If the spurious frequencies are not rejected then they could create unwanted in-band intermodulation products with the desired IF frequencies. Also the LO feedthrough at the output of the mixer is typically 0 dBm which is large enough to saturate the IF amplifier. Therefore these components are separated from the IF input by the diplexer whose output is terminated. The high pass output of the diplexer is therefore terminated and the low pass output of the diplexer is passed to the IF amplifier.

After the mixer's conversion loss, output padding, and filtering, the IF signal power is typically 20 dB less than the required full scale voltage swing of the ADC. It is important to drive the ADC near its full scale input voltage to maximize the fidelity of the acquired signal.

The IF amplifier [236] partially fulfills this need by typically adding 14 dB of gain to the IF signal. The IF amplifier typically does not have enough gain to get the IF signal power to the ADC's full scale range, so a second power amplifier [240] is needed with a high compression point. In this case the output power amplifier has an output 1 dB compression point (OP1 dB) of 32 dBm whereas the required IF output power is −4 dBm which is 36 dB lower than the power amplifier's OP1 dB. This separation is required to eliminate the possibility of distortion caused by the non linearity of the power amplifier. The IF amplifier also serves to drive the output power amplifier at an appropriate input power level. There is one filter [238] between the IF amplifier and the power amplifier. This filter is a stub that is tuned to shunt out any remnants of the LO feedthrough. It is critical to eliminate the LO feedthrough so as second not to saturate the power amplifier. A good shunt should be able to attenuate the LO feedthrough by 30 dB.

In the normal DBI enabled mode of operation, the SPDT PIN diode switch [242] is connected to the output of the IF power amplifier and passes the signal down the IF chain. However periodically, while the oscilloscope is operating, all the ADCs in the system need a dynamic calibration for a variety of reasons. The primary functions of the ADCs that are calibrated are the gain, offset, and delay of the ADCs. This dynamic calibration requires a delay calibration clock which is a square wave with roughly a 300 ps rise and fall time which is injected into the port labeled NCO Cal [243] of the IF module. A sample delay calibration clock is shown in FIG. 11. The dynamic calibration also requires a programmable DC voltage level that is controlled by the calibration software routine. The SPDT switch can be programmed by the software to disconnect the IF output from the signal path and connect the delay calibration clock. It is desirable to disconnect the IF signal so that it does not interfere with the calibration signals used by the calibration routine. In FIG. 2, the programmable DC level is generated by a 12-bit digital-to-analog converter (DAC) and is injected into the signal path through the bias tee [245] connected to the SPDT output via the port labeled DC Cal. Since both the delay calibration clock and DAC outputs are below the low frequency cutoff of the IF filters, they must be injected at the end of the chain bypassing the filters. While the SPDT switch and the bias tee add complexity to the signal path, these are desirable in order to gain the benefit of using a secondary input of the ADC to receive the downconverted signal.

The voltage limiter [246] connected to the output of the bias tee serves to protect the ADC from an over voltage condition. Under certain operating conditions, the voltage at the output of the IF could exceed the absolute maximum voltage rating of the ADC inputs. If this were to happen, the ADCs could be damaged and rendered unusable or might accelerate their mean time before failure (MTBF). To prevent this from happening, the voltage limiter is included to prevent such an over voltage condition from happening at the ADC input.

The final resistive power splitter [248] serves to create two copies of the IF signal to drive the inputs of two interleaved ADCs. The input of each interleaved ADC must be driven by a copy of the same signal. A simple 6 dB resistive splitter is used to accomplish this. In this design each output of the resistive splitter has a 2 dB pad giving a total attenuation of 8 dB. The additional 2 dB pads aid the voltage limiting of the IF output.

The design of the HF and VF band signal processing chains is nearly identical to the design of the MF band except for differences in the front end pads, band filter passband edges, LO frequencies, clock dividers, IF bandwidths and the nominal gains or attenuations of certain components. The front end pad attenuating for the HF band [252] is 2 dB and the front end pad attenuation for the VF band [254] is 1 dB. The decrease of pad attenuation with increasing RF frequency is a consequence of the increase of insertion loss associated with other components in the RF chain as their operating frequency increases. The pass band of the band filter for the HF band [256] approximately spans from 11 GHz to 18 GHz. The pass band of the band filter for the VF band approximately spans from 18 GHz to 25 GHz. The LO frequencies for each band are mentioned below. The clock divider for the VF band calls for a divide by 3 circuit [264]. The IF passband for the HF band is preferably approximately 0.541 GHz to 7.541 GHz. The IF passband for the VF band is preferably approximately 0.416 GHz to 7.416 GHz. The nominal gains of various amplifiers in each band's RF chain vary by up to 2 dB between bands depending on their operating frequency range. The nominal insertion loss of various attenuators in each band's RF chain also vary by up to 2 dB depending on the operating frequency range. However, aside from these minor differences between the MF, HF, and VF band downconverters relative to the MF band downconverter, each band is substantially structurally and functionally identical.

All downconverter outputs are acquired by their respective ADC nearly simultaneously (or employing other desirable time relationships as noted above) and are processed by software to be reassembled. The signal reassembly scheme is discussed below.

Before proceeding with a description of the signal acquisition and reassembly, it is important to discuss the LO generation scheme in this design. The ADCs used in this design preferably employ a synchronization output signal, herein referred to as SyncOut, that is effectively a division of the ADC sample clock. Internal to the ADC module is a circular memory buffer. This circular buffer is arranged into blocks that are 96 samples wide shown in FIG. 9. Each time the first location of a 96 sample block is filled, SyncOut is raised high. The memory is filled at 20 GSamples/second which will imply that SyncOut will be raised every 20/96 GHz. A low pass filter is applied to this signal to create a sinusoidal signal with a frequency of 20/96 GHz which is approximately 208.333 MHz. SyncOut is used as a reference for a frequency multiplier to generate the LO frequencies used in each band. The frequency multiplier in this design is a phase locked dielectric resonant oscillator or PDRO. Each PDRO in this design generates a frequency that is a phase locked integer multiple of the SyncOut frequency to drive the LO inputs of the mixers. The integer multiple is known as the LO multiplier. By using this LO scheme, the phase of the LO for each sample can be determined by the signal reassembly software, which is desirable to translate the acquired downconverted signals back into their original positions relative to the LF band, by looking up the original position in the circular buffer associated with that sample. The sequence that is used to calculate the digital LO is presented in Equation 1. A plot of the LO signal plotted against the SyncOut signal is shown in FIG. 10 which shows that the digital LO sequence repeats after 96 samples of the SyncOut signal. Other divisions of the sample clock, in addition to SyncOut, such as any multiple of SyncOut may also be equivalently employed.

$$LO[k] = \cos\left(2\pi M \frac{\mod(k, 96)}{96}\right) \quad \forall k = 0, 1, 2 \ldots \quad \text{Equation 1}$$

Where $M$ is the LO multiplier

The PDROs for the MF, HF, and VF band use multiplication factor of the SyncOut signal off 55, 89, and 122 respectively and are shown in FIG. 2, [260], and [262], respectively. The corresponding LO frequencies are approximately 11.45833 GHz 18.54166 GHz, and 25.4166 GHz, respectively.

This method of determining the phase of the LO is redundant with the method of the pilot tone injection shown in FIG. 2. This redundancy is used to recalculate an accurate LO when or wherever one of the methods is insufficiently accurate. In a particular embodiment which is not currently the preferred embodiment, the pilot tone is turned off. This scheme frees up the part of the dynamic range that was being used by the pilot tone injection, for a better signal-to-noise ratio (SNR). A beneficial side effect of this scheme for deriving the clock from the start-of-memory block clock, the LO clocks are intrinsically synchronized to the main clock of the DSO. In particular, it is then possible for the scope as a whole to be slaved to an external reference clock using the scope's external reference clock option.

Once the acquisition has been configured, the oscilloscope arms the acquisition and acquires LF, MF, HF and VF portions of the input signal. The remainder of this section describes the digital processing of the waveforms and the final recombination into a single DBI waveform acquisition.

FIG. 14 is a block diagram of the digital system utilized to process a single DBI channel. FIG. 13 shows the DBI processor in the processing web of the WaveMaster oscilloscope, and FIG. 14 serves as a block diagram of the processor. The processor has four input pins LF, MF, HF and VF to which CH1, CH2, CH3 and CH4 are connected respectively. The high bandwidth resultant waveform comes out of the output pin.

When waveforms are acquired by the LeCroy® WaveMaster® oscilloscope, they are applied appropriately to the MF, HF, VF input and LF input in FIG. 14. Each waveform acquired by the oscilloscope contains not only the waveform data consisting of an array of voltage levels, but also extra information that helps in the interpretation of the data points, including horizontal offset, horizontal interval, number of points, ADC sampling phase, vertical offset, and vertical step. Horizontal offset is defined as the time (relative to the oscilloscope trigger point) associated with the first point of the waveform. Horizontal interval is the time between each sample point; the reciprocal being the sample rate. The number of points is the number of points in the waveform. The ADC sampling phase describes which of the two interleaved 10 GS/s digitizers sampled the first waveform point (with the understanding that every other point is taken from every other digitizer). The vertical offset is the voltage associated with code 0. Vertical step is the voltage between each code.

FIG. 34 shows, in addition to the variable gain and attenuation settings determined for each vdiv, displayed results of a performed delay calibration. These depicted values [3401] represent the measured path delay of the MF, HF, VF paths relative to the LF path. Described differently, the LF, MF, HF and VF portions of the signal travel through different paths with the MF, HF and VF portions, in particular, traveling through a very long array of analog processing elements. These long paths serve to delay these waveforms relative to the LF waveform. The delay values are used to correct for the calculated difference in path propagation times and depends on the volts/div or vdiv setting. A negative delay means that the particular waveform must be advanced to arrive at the proper time. In accordance with the preferred embodiment of the invention, the DBI system does nothing in the hardware to account for the path propagation time differences. Rather, the propagation amount is measured and accounted for in the digital system by adding the respective delays to the horizontal offset of the MF, HF and VF waveforms acquired prior to processing. Of course, corresponding hardware compensation could be applied as desired.

Figure 16:
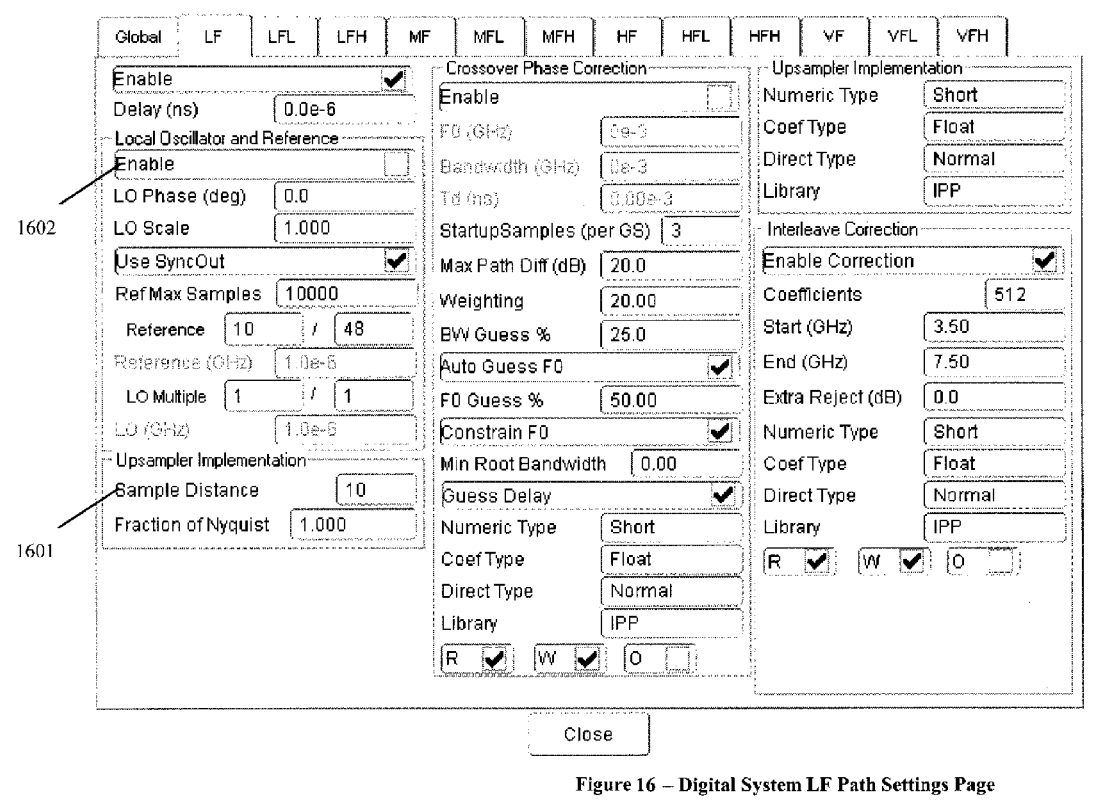

Prior to processing the waveforms, all of the digital elements shown in FIG. 14 in the MF, HF, VF and LF path are assembled, except for the elements designated as adaptors and upsampler and fractional delay filters. The filters are built according to specifications shown in FIGS. 15, 16, 17, 18. Once these elements are assembled, the system built with these elements is analyzed to account for three possible effects of each filter: The upsample factor, the startup samples, and the delay. The upsample factor is the factor by which the waveform sample rate is increased as it passes through a filter element and is generally 1 for all filters, except the upsampler and fractional delay filter, where the upsample factor is generally 4 [1501] when in the 25 GHz acquisition mode. The startup samples are the time required for the impulse response to end or die down to an acceptable amount. In the case of the DBI system constructed in accordance with the preferred embodiment of the present invention, almost all of the filters are finite impulse response (FIR) filters for simplicity of design and for simplicity in calculating delay and startup, and are symmetric (therefore producing no group delay variations). In the case of the symmetric FIR filter, the startup time is the filter length and the delay (in samples) is half the filter length. The analysis of the system paths with filter upsample factors, startup samples, and delay accounted produces overall equivalent filters from the standpoint of these three factors for the digital signal paths leading from the waveform inputs to the mixing node and the summing node. Calculation of these equivalent filters leads to a determination of integer and fractional delay of each path relative to the other. The integer delay portion is accounted for in the design of the adaptors, whose only purpose is to delay the waveform an appropriate number of integer samples. The fractional delay portion is accounted for in the design of the upsampler.

Each upsampler is preferably designed utilizing a polyphase filter arrangement where each filter phase is calculated by sampling a Sync pulse. Simply shifting the Sync prior to sampling accomplishes the fractional delay. The design of fractional delay filters and upsampling filters (sometimes referred to as interpolating filters) is well known. An exhaustive discussion of the design of these type of filters can be found in Smith, Julius O., MUS420/EE367A Lecture 4A, Interpolated Delay Lines, Ideal Bandlimited Interpolation, and Fractional Delay Filter Design, Stanford University 1-50, dated Dec. 28, 2005.

In general, all of the digital processing elements are built once at inception, except for the adaptors and upsampler and fractional delay filters. These are built on each waveform acquisition to account for variations in the horizontal waveform information. These are always built so that the processed waveforms arrive at the summing node at the correct time.

Consider the LF input in FIG. 14. The path begins with the LF signal entering the LF Interleave correction filter. A description of this filter is described in Mueller, et al., U.S. Provisional Patent application 60/656,616, filed Feb. 25, 2004 titled Method and Apparatus for Spurious Tone Reduction in Systems of Mismatched Interleaved Digitizers, as listed above, and U.S. patent application Ser. No. 11/280,493, filed Nov. 16, 2005, titled "Method and Apparatus for Artifact Signal Reduction in Systems of Mismatched Interleaved Digitizers", now U.S. Pat. No. 7,386,409 and claiming the benefit of the '616 provisional application noted above. It suffices to say that this filter is designed to improve the digitizer matching of the two interleaved 10 GS/s digitizers that produce the 20 GS/s. As such, it serves to reduce the size of distortion components resulting from inadequate digitizer frequency response matching.

The LF waveform then enters the LF adaptor, which serves to delay the waveform by an integer number of samples. The waveform then enters the upsampler and fractional delay filter. This filter, as mentioned previously, serves to provide fractional sample delay and to increase the sample rate from 20 GS/s to 40 GS/s or 60 GS/s or 80 GS/s depending on the user's choice of acquisition modes shown in FIG. 32. This upsampling is perfectly valid because the frequency content of the LF input signal has been band limited to 6 GHz by the diplexer at the DBI channel input and by limitations of the oscilloscope front-end. The upsampler is configured based on upsampler settings in the dialog shown in FIG. 15, 16 [1601]. This dialog specifies the upsample factor, the sample distance and an optimization. The upsample factor is generally set to 4, but higher upsample factors can be utilized. The sample distance refers to the distance in samples from the input waveform to apply the sin(x)/x interpolation. Said differently, it is one half the length of each filter phase where the number of phases is determined by the upsample factor. The optimization enables special processing utilizing Intel performance libraries in which the input waveform to the upsampler is fed into each filter phase and interleaved using Intel performance primitives (IPP). The description of all Intel performance library functionality can be found in Intel Integrated Performance Primitives for Intel Architecture, Reference Manual, Volume 1: Signal Processing, 2003.

Referring once again to FIG. 14, the upsampled LF waveform then enters a low pass filter. The response of this low pass filter is shown in FIG. 20. This filter has been built according to the low pass filter specifications shown in FIG. 18 and has been designed using a well known technique called frequency sampling, as described in Jong, Methods of Discrete Signal and Systems Analysis, McGraw Hill, 1982, pg. 369. The low pass filter specifications dictate 400 filter coefficients, a low cutoff at 0, a high cutoff at 6.4 GHz, and a transition band of 800 MHz. The purpose of this filter is to reject any extra noise and spurs in the LF path beyond 6 GHz.

As will be shown, there is an approximately 200-300 MHz wide region where the LF-MF, MF-HF and HF-VF bands interfere. This region is designated as the crossover region. It is important that this interference be constructive in nature. One way to ensure this is to ensure that the phase of the low frequency band relative to the high frequency band is essentially zero while the bands are transitioning. A topic ignored up to this point in the design of the DBI hardware is that sharp filters tend to have extreme phase changes near the band edges. The crossover phase correction element is a filter designed to compensate for this by making the relative phase approximately zero throughout the crossover region. A description of an example of such a crossover phase correction element is found in Pupalaikis, et al., U.S. patent application Ser. No. 11/960,137, filed Dec. 19, 2007, titled Method of Crossover Region Phase Correction When Summing Multiple Frequency Bands, now U.S. Pat. No. 7,711,510, which claims priority to, in part, U.S. patent application Ser. No. 11/280,671, filed Nov. 16, 2005, now abandoned. Depending on the response of the hardware filters, a crossover phase correction might be needed. In this design because of slow roll-offs of the hardware filters, the phase transition in the crossover region is nearly zero. So no crossover phase correction is needed.

The low pass filtered LF band then enters a scaling element and then the summing node. This operation will be described following the description of the MF, HF and VF path processing. Note that the processing on MF, HF and VF waveforms is similar as shown by the block diagram in FIG. 14.

Now, the processing of the MF path is described. The MF waveform enters an interleave correction filter, an adaptor, and an upsampler and fractional delay filter that works in the same manner as previously described for the LF path, but with different internal design specifications depending on the ADC matching of the MF signal path, and the delay of the MF path. There are separate dialog pages for MF, HF and VF each of which are similar to the ones shown for LF in FIGS. 16-18. The specifications for the upsampler are entered in a dialog page shown in FIG. 15, 16 [1601].

The LO tone generated for the MF band is a 55 times multiple of the ADC SyncOut signal of 208.333 MHz. The tone frequency is 11.458 GHz. The injected LO reference tone is 5.729 GHz.

The MF waveform can now be passed through the low image filters depending on the noise performance of the hardware. If there are spurs outside 5.5 GHz the low image filters can eliminate them, improving the noise performance of the system. The specifications for this filter can be set on the dialog page similar to the one shown in FIG. 17. In this design due to good hardware performance and better specifications of the MF high image filter the low image filter is not needed. The rejection provided by the MF high image filter for the 11.458 GHz frequency does the same job as the MF low image filter, eliminating its need.

The MF waveform can pass through a 5,729 GHz notch filter. This filter is specifically designed to remove the 5.729 GHz LO reference tone riding on the signal. Here in this design the use of this filter is bypassed as the MF high image filter attenuates the 5.729 GHz frequency by more than 50 dB, thus saving some processing time.

The MF waveform then enters a digital mixer. The discussion of the processing of the MF path will now be postponed while the method of generating the digital LO is described.

The specifications for the LO tone generation and phase recovery can be set on the dialog page similar to one shown in FIG. 16. The generation of the digital LO begins with the split in the MF path. Before the digital LO is generated, the phase of the LO must first be determined. The LO phase is determined based on the LO reference riding on the MF waveform. Referring back to FIG. 2, one can see that the PLO output is delivered to the mixer LO input along one signal path [222], and is simultaneously picked off, divided down in frequency [224], and inserted into the MF waveform [228] as the LO reference at the splitter combiner. This LO reference signal has a constant phase relationship to the LO waveform delivered to the mixer. It is not important that the exact phase of the LO be known, only that the LO reference have a constant phase relationship to it. As such, the LO reference tone carries the phase information required to determine the phase of the LO (with a constant offset). The constant offset difference between the LO reference and the actual LO is accounted for through the calibration of MF delay shown in FIG. 34. One way to generate the digital LO that is phase locked to the LO reference tone is to utilize a digital phase-locked loop (PLL). While certainly possible, this has been deemed as overkill for this design and a digital PLL would be computationally intensive. Instead, the design makes use of the fact that the frequency of the LO reference tone relative to the oscilloscope sample clock is extremely stable due to the fact that the 100 MHz PLO reference output is supplied to the oscilloscope as the reference that generates the oscilloscope's sample clock. Therefore, the frequency is stable. Furthermore, because the LO reference is so high in frequency (essentially as high as possible for capture by an oscilloscope front-end with 6 GHz of bandwidth), only a small number of cycles are required to accurately determine the phase of the LO reference.

One way to determine the phase of the 5.729 GHz LO reference is to take the discrete Fourier transform (DFT) of some number of samples of the MF waveform and pick out the frequency component that occurs at 5.729 GHz. The phase of this frequency component is the phase of the LO reference. Since the sample clock generator in the oscilloscope and the LO are generated using the same 100 MHz reference (i.e. the LO and the sample clocked are locked together), there is no ambiguity regarding the exact frequency bin in the DFT containing the 5.729 GHz component. In other words, even if there were slight errors in the exact frequency of the LO and therefore the 5.729 GHz LO reference, these slight errors would occur simultaneously in the frequency of the sample clock, and if one assumed that the oscilloscope sample rate was exactly 20 GS/s, he would measure the LO reference to be exactly 5.729 GHz.

a. Since the DFT and even the fast Fourier transform (FFT) are somewhat computationally expensive, and because the DFT provides more information than is actually needed, a well known, easier method for tone detection is utilized. This method is called the Goertzel algorithm and is described in Digital Signal Processing Applications Using The ADSP-2100 Family, Prentice Hall, 1990, pg. 458. The block diagram of a digital processing element that accomplishes the LO reference phase is shown in FIG. 19, where the number of points utilized (K) and the frequency bin (n) is determined by the local oscillator and reference specifications shown in [1602]. The specifications dictate that the LO reference is at 5.729 GHz, to use a maximum of 5000 cycles for LO determination, and that the acquisition should have multiples of 192 points. The cycles multiple makes the number of samples integer and therefore allows for phase detection without resorting to the well known technique of windowing. The minimum number of LO reference cycles available in a given waveform is dictated indirectly by the specification of the minimum acquisition duration, as specified in FIG. 33.

Knowing the phase of the LO, tone can be generated using Intel IPP libraries. For another embodiment of this invention, once the phase detector has measured the phase of the LO reference has (which must be performed for every individual waveform acquired), it is passed to the digital LO generator.

A block diagram of the LO generator is shown in FIG. 30. It shows that the tone is generated utilizing a lookup table utilizing the local oscillator and reference specifications similar to what is shown in [1602]. The specifications dictate that the cycles multiple is 23, which means that the sine wave, regardless of phase, will repeat every 80 samples. Therefore, a table of 80 sine wave values is generated for the lookup table. The lookup table is utilized to calculate the sine wave output for each point k by looking up the value at element mod(k,K) to generate the proper LO waveform at point k.

This means that for every waveform point in the MF signal, an accompanying LO waveform can be generated that is phase locked relative to the MF signal to the LO applied to the mixer LO input shown in FIG. 2.

Returning to the description of the MF path, and particularly the mixer in FIG. 14, the digitally generated LO is multiplied with the MF waveform applied to the mixer. This digital mixing action causes the input frequency band from 458 MHz to 5.458 GHz to produce two new images, as shown in FIG. 21. It is important to note that the band located from 6 to 11 GHz contains the desired frequency content provided in the 458 MHz to 5.458 GHz range, but flipped in frequency. The frequency flipping action caused by the DBI hardware due to the high-side downconversion has now been undone and the frequency band has been restored to its correct frequency band location. Another image is produced from 12 to 17 GHz that is an undesired image. At this point, the requirement for upsampling should be apparent. If the MF waveform was not upsampled, the 12 to 17 GHz band would be aliased into a band from 3 to 8 GHz and would cause problems. Upsampling allows this band to have a benign effect.

The MF waveform proceeds from the digital mixer to the MF high image filter. The specifications of this filter can be changed on the dialog page similar to one shown in FIG. 18. It is a symmetric FIR built utilizing frequency sampling methods. The specifications dictate 400 filter coefficients, a low cutoff at 6.12 GHz, a high cutoff at 11.25 GHz, and a transition band of 600 MHz. Its response is shown in FIG. 22. It is important to examine the region around 11.458 GHz to ensure the proper rejection of the input DC component. The purpose of this filter is to reject the image produced by the mixing action in the 12 to 17 GHz range as shown. This filter also limits the band of interest from 6 to 11 GHz and attenuates by more than 50 dB the 5.75 GHz LO reference frequency and the DC component which shows up at 11.458 GHz as seen in FIG. 23.

The combination of all of the filters in the MF path is shown in FIG. 23. This represents the response of the digital system to the MF input.

The scaling of the LF waveform is simply 1. It has already been acquired under the correct conditions. The scaling of the MF waveform depends simply on the relationship of the DBI channel vdiv setting (which is the same as the LF front-end vdiv setting) and the 50 mV/div range used to acquire the MF waveform. The MF waveform scaling is calculated as simply:

$$MFGain = \frac{LFVdiv}{MFVdiv} \cdot 2 \qquad \text{Equation 2}$$

MF vdiv is, in this situation, a constant 50 mV/div and the factor of 2 accounts for the fact that each frequency band created by the mixing action is half size. While this factor could have been accounted for by doubling the size of the digital LO, in the present example processing is performed within the oscilloscope utilizing integer arithmetic. This would have caused an overflow. It is more efficient to account for this scaling utilizing Equation 2.

The HF and VF waveform go through the exact sequence of digital processing as the MF waveform. The specifications of the processing units like the filter bandwidth, filter start and stop frequencies, LO reference and mixer frequency are different, but the theory is the same. The scaling is the same as the MF. FIGS. 24-29 depict the specifications of the image filters used for the particular paths and the final responses for HF and VF bands. Also the dialog pages where the specifications for the image filters and LO generators are specified are similar for LF, MF, HF and VF bands. The dialog pages for LF bands are shown in FIGS. 16-18.

After scaling the LF, MF, HF and VF waveform using the gain element, the scaled waveforms are combined by the summer that simply adds them together. The overall response of the digital system as a result of this processing is shown in FIG. 31 where the LF, MF, HF and VF path response is shown along with the combined response. It can be seen that the digital processing preserves the 25 GHz bandwidth specification.

FIG. 31 shows the non-flatness caused by the band combination. These non-flat regions are designed specifically to take care of hardware filter characteristics, so that the system response is flat in the band overlap region. Obvious improvements can be made to the flatness of the resulting signal based on minor tweaks of the filter specifications.

The result of the processing in FIG. 14 up to this point is to split the signal into four frequency bands, inject one band into oscilloscope ADC via front-end amplifiers, and the others directly to ADCs to acquire the waveforms, and digitally process the waveform to provide a 25 GHz waveform acquisition. The analog processing of these waveforms leads to magnitude response and group delay non-flatness, which causes distortion in the frequency response and time domain response of the system. For this reason, techniques are utilized to compensate the magnitude response and group delay to provide a good overall response. Methods for performing this process are described in Pupalaikis, U.S. Pat. No. 6,701,335, (Reissued as U.S. Pat. No. RE 39,693).

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method of digitizing an analog signal, comprising the steps of:

separating the analog signal spanning a frequency range into a plurality of frequency bands, each frequency band spanning a corresponding predefined frequency range, at least a portion of each of the plurality of corresponding predefined frequency ranges not overlapping any other of the plurality of corresponding predefined frequency ranges;

translating at least one of the signals in the plurality of frequency bands to a lower frequency band employing a local oscillator;

digitizing the at least one translated signal with digitizing elements having a frequency range less than the analog signal frequency range;

defining a fixed relationship of the phase of the local oscillator and a repetitive signal generated upon a writing to a circular buffer of the digitized representation of the at least one translated signal corresponding to at least one of the plurality of frequency bands;

digitizing the signals corresponding to the plurality of frequency bands other than the frequency band containing the translated at least one signal and writing these digitized signals to corresponding circular buffers employing one or more corresponding local oscillators;

forming a digital representation of the analog signal from the digitized signals, the digital representation substantially spanning the frequency range of the analog signal; and storing the digital representation in a computer readable medium.

2. The method of claim 1, wherein forming a digital representation of the analog signal from the digitized signals comprises frequency converting the at least one digitized translated signal employing the phase of the local oscillator corresponding to the circular buffer storing the at least one digitized translated signal, and combining the converted at least one digitized translated signal and other digitized signals.

3. The method of claim 1, wherein the forming a digital representation of the analog signal from the digitized signals comprises synchronizing in time samples stored in each of the circular buffers.

4. The method of claim 1, wherein the phase of the local oscillator corresponding to each of the translated signals utilized for initially translating the signals to a lower frequency band are utilized for translating the digitized translated signals back to the corresponding original frequency bands.

5. The method of claim 4, wherein a relative phase of the local oscillators is represented by a relative offset of corresponding locations in each of the plurality of circular buffers.

6. The method of claim 1, wherein each local oscillator is synchronized to a single external reference clock.

7. The method of claim 1, wherein each local oscillator is synchronized to a single internal system clock.

8. The method of claim 7, wherein the single internal system clock is synchronized to a single external reference clock.

9. A system for acquiring an analog signal, comprising:

an analog input to receive an analog input signal spanning a frequency range, the frequency range comprising a plurality of frequency bands, each frequency band spanning a corresponding predefined frequency range, at least a portion of each of the plurality of corresponding predefined frequency ranges not overlapping any other of the plurality of corresponding predefined frequency ranges;

a first signal path to transport a first signal occupying a first of the frequency bands;

a second plurality of signal paths to transport each of a corresponding plurality of signals occupying a corresponding plurality of frequency bands, each of the second plurality of signal paths selectively providing one of a passed through acquired signal and a translated portion of the analog input signal corresponding to one of the plurality of predefined frequency ranges;

a digitizing system to digitize the first signal and second plurality of signals, the digitizing system having a frequency range less than the analog input signal frequency range;

a plurality of frequency translators for selectively substantially restoring digitized translated second signals back to the corresponding original frequency bands; and a digital combiner to join the first signal and the second signals and form a digital representation of the analog input signal, the digital representation substantially spanning the frequency range of the analog input signal.

10. The system of claim 9, wherein each of the second plurality of signal paths comprises a down converter for translating a portion of the analog input signal corresponding to the predefined frequency range corresponding thereto.

11. The system of claim 10, wherein each down converter comprises a local oscillator, and wherein the local oscillator is mixed with the corresponding portion of the analog input signal.

12. The system of claim 9, wherein the joined second signals comprise second signals provided by a path that selectively provided a translated portion of the analog input signal.

13. The system of claim 9, further comprising, corresponding to each of the second signal paths, a switch for selectively providing one of the passed through acquired signal and the translated portion of the analog input signal.

14. The system of claim 13, further comprising:

corresponding to each of the second signal paths, a selector for selecting between the translated signal and a first calibration signal; and a calibration programmable voltage reference;

wherein the first calibration signal is employed to match a sampling delay corresponding to each of the plurality of second signal paths; and wherein the calibration programmable voltage reference is employed to match gains and offsets between a plurality of interleaved digitizers corresponding to one of the plurality of second signal paths.

15. The system of claim 14, wherein the first calibration signal is further employed to equally space a sampling delay of interleaved digitizers corresponding to one of the plurality of second signal paths.

16. A method for acquiring an analog signal, comprising:

receiving an analog input signal spanning a frequency range, the frequency range comprising a plurality of frequency bands, each frequency band spanning a corresponding predefined frequency range, at least a portion of each of the plurality of corresponding predefined frequency ranges not overlapping any other of the plurality of corresponding predefined frequency ranges;

transporting a first signal occupying a first of the plurality of frequency band along a first signal path;

transporting each of a corresponding plurality of signals occupying a corresponding plurality of frequency bands along a second plurality of signal paths, each of the second plurality of signal paths selectively providing one of a passed through acquired signal and a translated portion of the analog input signal corresponding to one of the plurality of predefined frequency ranges, each of the second plurality of signal paths further providing selection between the translated signal and a first calibration signal, and a calibration programmable voltage reference, wherein the first calibration signal is employed to match a sampling delay corresponding to each of the plurality of second signal paths, and wherein the calibration programmable voltage reference is employed to match gains and offsets between a plurality of interleaved digitizers corresponding to one of the plurality of second signal paths;

digitizing the first signal and second plurality of signals by a plurality of digitizing systems, each having a frequency range less than the analog input signal frequency range;

selectively substantially restoring digitized translated second signals back to the corresponding original frequency bands; and joining the first signal and the second signals and form a digital representation of the analog input signal, the digital representation substantially spanning the frequency range of the analog input signal.

\* \* \* \* \*